United States Patent [19]
Uno et al.

[11] Patent Number: 6,004,701
[45] Date of Patent: Dec. 21, 1999

[54] METHOD FOR DESIGNING LEVENSON PHOTOMASK

[75] Inventors: Taiga Uno, Kawasaki; Kiyomi Koyama, Yokohama; Kazuko Yamamoto, Tokyo; Satoshi Tanaka, Kawasaki; Sachiko Kobayashi, Ichikawa; Koji Hashimoto, Yokohama, all of Japan

[73] Assignee: Kabushiki Kaisha Toshiba, Kawasaki, Japan

[21] Appl. No.: 09/046,794

[22] Filed: Mar. 24, 1998

[30] Foreign Application Priority Data

Mar. 25, 1997 [JP] Japan .................................. 9-071929
Sep. 30, 1997 [JP] Japan .................................. 9-267346

[51] Int. Cl.$^6$ .............................. G03F 9/00; G06F 17/50
[52] U.S. Cl. ...................... 430/5; 395/500.2; 395/500.22
[58] Field of Search ............................. 395/500.2; 430/5

[56] References Cited

U.S. PATENT DOCUMENTS

| | | | |
|---|---|---|---|
| 5,338,626 | 8/1994 | Garofalo et al. | 430/5 |
| 5,441,834 | 8/1995 | Takekuma et al. | 430/5 |
| 5,468,578 | 11/1995 | Rolfson | 430/5 |
| 5,538,815 | 7/1996 | Oi et al. | 430/5 |
| 5,541,025 | 7/1996 | Oi et al. | 430/5 |
| 5,761,075 | 6/1998 | Oi et al. | 364/488 |
| 5,795,683 | 8/1998 | Uno et al. | 430/5 |

FOREIGN PATENT DOCUMENTS

| | | |
|---|---|---|
| 5-341497 | 12/1993 | Japan . |
| 6-167801 | 6/1994 | Japan . |
| 6-308714 | 11/1994 | Japan . |

OTHER PUBLICATIONS

A. S. Wong, et al., "Investigating Phase–Shifting Mask Layout Issues Using a CAD Toolkit", Proc. Of International Electron Devices Meeting, IEEE, Dec. 8, 1991, pp. 705–708.

A. Moniwa, et al., "Algorithm for Phase–Shift Mask Design with Priority on Shifter Placement", Jpn. J. Appl. Phys., vol. 32, Part 1, No. 12B, Dec. 1993, pp. 5874–5879.

Y. Hirai, et al., "Automatic Pattern Generation System For Phase Shifting Mask", 1991 Symposium on VLSI Technology Digest of Technical Papers, 1991, 2 pages.

*Primary Examiner*—Kevin J. Teska
*Assistant Examiner*—A. M. Thompson
*Attorney, Agent, or Firm*—Oblon, Spivak, McClelland, Maier & Neustadt, P.C.

[57] ABSTRACT

In a Levenson photomask design method of partially forming a plurality of opening patterns for passing incident light in a light-shielding film for shielding the incident light, and arranging, on some patterns, phase shifters, line segment pairs of different patterns which are adjacent to each other within a predetermined distance R are extracted in units of line segments obtained by dividing the patterns. A pattern within a predetermined distance S from the central point of the opposite region of a line segment pair of interest in a direction perpendicular to the line segments is obtained. The obtained pattern is subjected to a process simulation to obtain resolution easiness representing the easiness in resolving the adjacent patterns. On the basis of the resolution easiness obtained for the adjacent pattern pair within the distance R, a phase shifter is arranged in ascending order of resolution easiness to give a phase difference. Resolution suitable for the exposure condition used can be obtained by a simple method. When the shifter arrangement is determined in consideration of the resolution easiness, a high-resolution shifter arrangement can be realized for a Levenson phase shift mask.

28 Claims, 26 Drawing Sheets

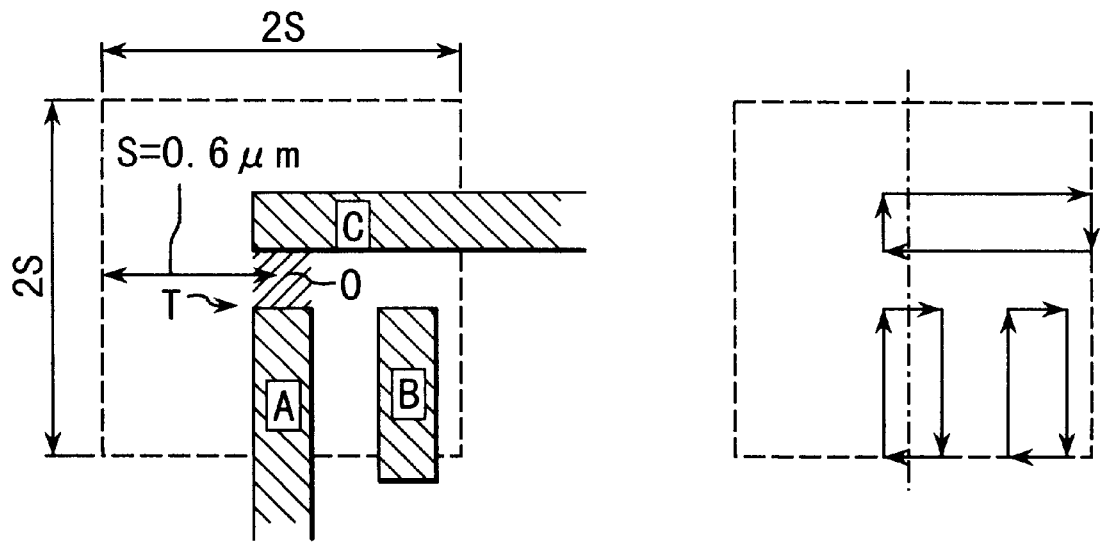
FIG. 12A
FIG. 12B
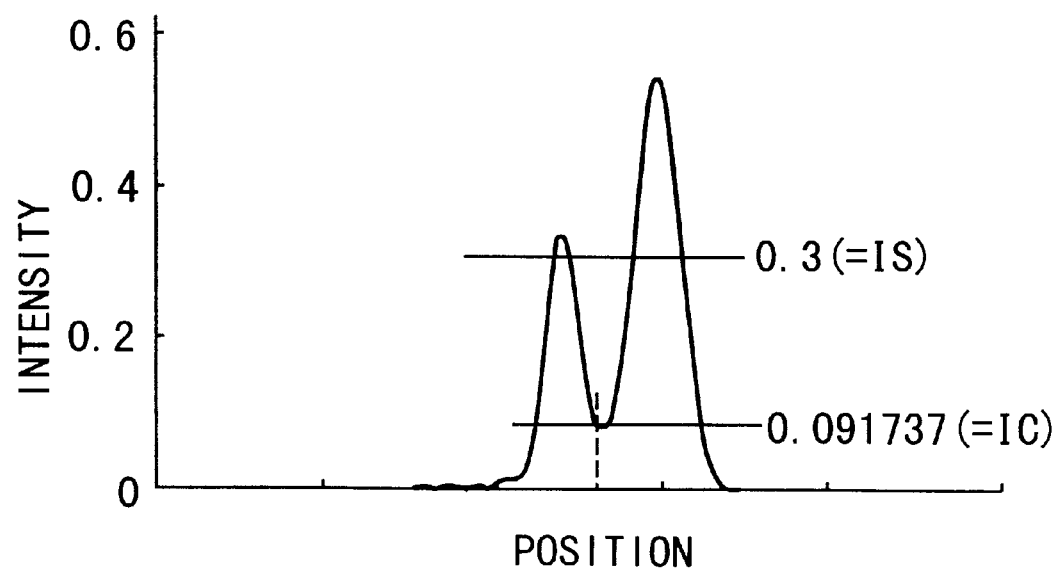
FIG. 12C

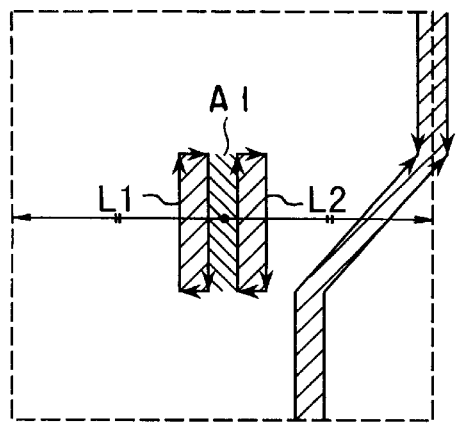 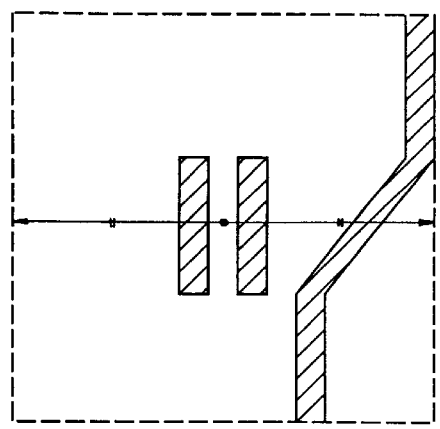
FIG. 18A  FIG. 18B
FIG. 18C
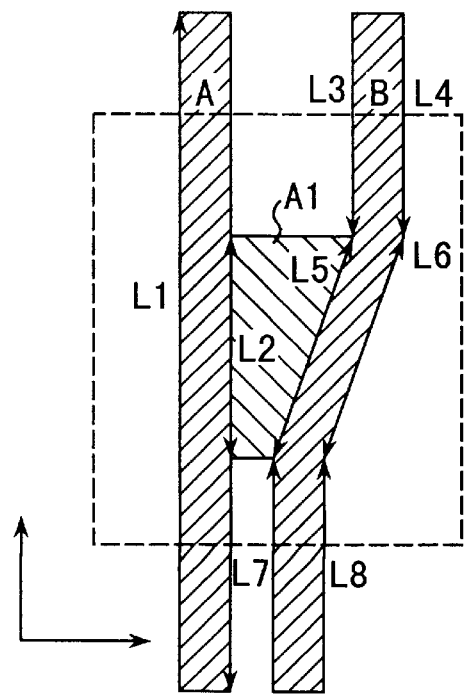
FIG. 19

METHOD FOR DESIGNING LEVENSON PHOTOMASK

BACKGROUND OF THE INVENTION

The present invention relates to a photomask design method for the manufacture of a semiconductor device and, more particularly, to a method of designing a photomask such as a Levenson phase shift mask in which a phase shifter is formed of one of adjacent patterns. The present invention also relates to a photomask design apparatus and a recording medium storing a program for realizing photomask design with a computer.

This application is based on Japanese Patent Application No. 9-71929, filed Mar. 25, 1997 and Japanese Patent Application No. 9-267346, filed Sep. 30, 1997, the content of which is incorporated herein by reference.

The following techniques are known as conventional Levenson phase shift mask design methods.

First prior art: "Automatic Pattern Generation System for Phase Shifting Mask", Symposium on VLSI Technology, JSAPCAT, No. AP911210 (1991), pp. 95–96.

This paper examines an automatic shifter arranging method. In automatically assigning the phases of light passing through patterns, an arbitrary pattern is selected first, and a phase of 0° is assigned for the selected pattern. For the next arbitrary pattern, a phase opposite to that of a pattern near the next selected pattern, whose phase is already assigned and which has a longest side opposing the next pattern, is assigned. If there are a plurality of patterns whose longest sides oppose the next pattern, and they have different phases, a warning is issued, and processing is stopped.

Second prior art: Andrew. R. Neureuther et al., "Investigating Phase-shifting Mask Layout Issues Using a CAD Toolkit", IEDM Tech. Digest, 1991, pp. 705–708.

This paper explains an apparatus which automatically arranges a shifter for a given design layout which is reduced based on the reduction magnification determined by the designer, and if the automatic shifter arrangement has an inconsistent portion, displays that portion.

Third prior art: Japanese Patent Publication (KOKAI) No. 5-341498.

This prior art discloses a method in which if the distance between transparent regions is smaller than a threshold value, a shifter is arranged on one of the transparent regions, and if the shifter arrangement has a conflict, the designer is notified of it. This prior art also discloses an apparatus having an automatic shifter arrangement function, a shifter verification function and a shifter arrangement/verification function for a layout with some shifters already arranged.

Fourth prior art: Japanese Patent Publication (KOKAI) No. 7-13326.

This prior art describes a technique of weighting sides under various conditions where each nodes represents an aperture and each sides represents adjacent relationship of two apertures, and assigning the same phases to nodes at the two ends of at least one side of each closed loop in descending order of weight of sides.

Fifth prior art: "Algorithm for Phase Shift Mask Design with Priority on Shifter Placement", Jpn. J. Appl. Phys. Vol. 32 (1993), PP. 5874–5879, and Japanese Patent Publication (KOKAI) No. 6-308714.

This prior art discloses a method and apparatus for extracting, from an input layout, combinations of two patterns which are adjacent within a designated value, assigning priority in phase shifter arrangement in descending order of length of a side adjacent to the other pattern of the combination, and alternately placing phase shifters in descending order of the priority in shifter arrangement.

Sixth prior art: Japanese Patent Publication (KOKAI) No. 8-328237.

This prior art discloses a method in which, in design data formed from patterns as transparent regions, the adjacent relationship of patterns which are close to each other within a threshold value, all combinations of adjacent patterns are extracted from each adjacent group based on the adjacent relationship, the combinations are sorted in descending order of correction difficulty, the reverse relationship of phase is prepared based on the sorting result, and the phase is assigned based on the prepared reverse relationship.

Seventh prior art: "Computer Aided Design Software for Design Phase-shifting Masks", JPN. J. Appl. Phys. Vol. 32 (1993), pp. 5887–5891.

This paper examines a method of assigning the phase based on the adjacent relationships of patterns, starting from the patterns whose phases has been assigned by designer in advance.

However, these prior arts have the following problems.

The first to third prior arts merely describe the phase assigning method based on a specific pattern as an initial pattern regardless of the presence/absence of phase inconsistency, and no effective shifter arrangement cannot be found even when the phase assignment result is obtained. Therefore, these prior arts cannot realize a shifter arrangement with high resolution.

In the fourth to sixth prior arts, the phase is assigned by weighting in consideration of the length of adjacent sides or the distance between adjacent patterns, so a conflict which is easy to correct can be obtained. However, the resolution is not taken into consideration. For this reason, if there are pattern pairs having almost the same correction easiness but an obvious difference in resolution, phase assignment for salvaging a pattern pair with lower resolution cannot be made. In these prior arts, therefore, no shifter arrangement capable of obtaining high-resolution patterns cannot be realized.

For, e.g., a DRAM, the phase for the memory cell portion is sometimes manually assigned. In this case, the phase of a pattern in the sense amplifier portion or row decoder portion which have not been subjected to phase assignment yet must be assigned without changing the already assigned phase information. From the viewpoint of determining the phase based on a pattern already having a certain phase (fixed phase), each of the first to third prior arts merely describes phase assignment using a specific pattern as an initial pattern, so phase assignment while considering the fixed phase cannot be performed.

The fourth prior art describes a method of minimizing conflicts although this method does not allow phase assignment while considering the fixed phases. In the fifth or sixth prior art, the phase can be assigned in accordance with priority based on the correction easiness although a phase assignment cannot be made in consideration of fixed phases. The seventh prior art takes fixed phases into consideration. However, since this phase assigning method is based on adjacent relationships, phase assignment cannot be made in consideration of resolution easiness or correction easiness at the phase conflict portions.

BRIEF SUMMARY OF THE INVENTION

Accordingly, it is an object of the present invention to provide a simple photomask design method which allows to obtain higher resolution in accordance with the exposure condition, and a shifter arrangement capable of realizing a high-resolution pattern in, e.g., a Levenson phase shift mask.

It is another object of the present invention to provide a photomask design method which allows to assign the phase of a portion which has not been subjected to phase assignment yet in consideration of adjacent pattern pairs with priority levels without changing the fixed phase which is already assigned.

It is still another object of the present invention to provide a photomask design apparatus for realizing the above design method and a recording medium which stores a program for realizing the above design method.

According to the present invention, there is provided a photomask design method of forming a plurality of opening patterns for passing incident light in a light-shielding film and arranging, on some patterns, phase shifters for giving a phase difference to the incident light transmitted through the patterns, comprising the following steps of:

extracting an adjacent pattern pair within a predetermined distance;

performing at least one of a process simulation or an experiment for patterns within another predetermined distance from an opposite region of the adjacent pattern pair to obtain resolution easiness representing an easiness in resolving the adjacent pattern pair; and arranging phase shifters on adjacent pattern pairs to give a phase difference in ascending order of resolution easiness.

According to the present invention, there is provided another photomask design method of forming a plurality of opening patterns for passing incident light in a light-shielding film, the opening patterns including patterns already having fixed phases, and arranging, on some patterns, phase shifters for giving a phase difference to the incident light transmitted through the patterns, comprising the following steps of:

extracting an adjacent pattern pair within a predetermined range;

assigning priority to the extracted adjacent pattern pair;

generating a node from a design layout and giving, to a node of a pattern having a fixed phase, a phase value corresponding to phase information of the pattern;

in order of priority levels of adjacent pattern pairs, (i) connecting nodes of the adjacent pattern pair so as not to form a closed loop of an odd number of nodes when neither nodes of the adjacent pattern pair have phase information, and (ii) giving phase information opposite to that of one node to the other node and sequentially giving phase information to nodes connected to the nodes of which phases are assigned such that the phases of 0° and 180° are alternately assigned to the adjacent nodes when only one node of the adjacent pattern pair has phase information; and setting an initial pattern for a group which is obtained by connecting nodes of adjacent pattern pairs and for which phase assignment is not done yet and determining phase by tracing the connected nodes from the initial pattern.

According to the present invention, there is provided a computer readable recording media storing a program for designing a photomask in which a plurality of opening patterns for passing incident light are formed in a light-shielding film, and some patterns have phase shifters for giving a phase difference to the incident light transmitted through the patterns, the program comprising the following steps of:

decomposing patterns into line segments;

extracting line segment pairs which are adjacent within a predetermined distance R and belong to different patterns;

obtaining, in units of line segments, a pattern formed of lines and spaces within a predetermined distance S from the central position of an opposite region where the line segments oppose each other in a direction perpendicular to the line segments;

obtaining resolution easiness representing the easiness in resolving the line segments of adjacent patterns using a process simulation, an experiment, or a combination thereof for the obtained pattern; and determining a phase shifter arrangement to give a phase difference to the line segments of adjacent patterns in order of resolution difficulty (in ascending order of resolution easiness).

According to the present invention, there is provided another computer readable recording medium storing a program for designing a photomask in which a plurality of opening patterns for passing incident light are formed in a light-shielding film, and some patterns have phase shifters for giving a phase difference to the incident light transmitted through the patterns, the program comprising the following steps of:

extracting an adjacent pattern pair within a predetermined distance R;

decomposing each pattern into line segments;

obtaining a pattern formed of lines and spaces within a distance S from the central position of an opposite region in a direction perpendicular to the line segments, the opposite region being expected to be most hard to resolve;

obtaining resolution easiness representing the easiness in resolving the adjacent patterns using a process simulation, an experiment, or a combination thereof for the obtained pattern; and arranging phase shifters based on the obtained resolution easiness of the patterns adjacent within the distance R to give a phase difference in order of resolution difficulty (in ascending order of resolution easiness).

According to the present invention, there is provided still another computer readable recording medium storing a program for designing a photomask in which a plurality of opening patterns for passing incident light are formed in a light-shielding film, and some patterns have phase shifters for giving a phase difference to the incident light transmitted through the patterns, for the design layout including patterns already having fixed phases, the program comprising the following steps of:

extracting an adjacent pattern pair within a predetermined range;

assigning priority to the extracted adjacent pattern pair;

generating a node from the design layout;

giving, to a node of a pattern having a fixed phase a phase value corresponding to the phase information of the pattern;

in order of priority levels of adjacent pattern pairs, (i) connecting nodes of the adjacent pattern pair so as not to form a closed loop of an odd number of nodes when neither nodes of the adjacent pattern pair have phase information, and (ii) giving phase information opposite to that of one node to the other node and sequentially giving phase information to nodes connected to the nodes of which phases are assigned such that the phases of 0° and 180° are alternately assigned to the adjacent nodes when only one node of the adjacent pattern pair has phase information; and setting an initial pattern for a group which is obtained by connecting nodes of adjacent pattern pairs and for which phase assignment is not done yet and determining phase by tracing the connected nodes from the initial pattern.

According to the present invention, portions adjacent to each other within a threshold design R in the design layout are extracted, patterns near the extracted adjacent portions are extracted, and the extracted patterns are subjected to a process simulation, experiment, or a combination thereof to obtain resolution easiness for the adjacent patterns. With this arrangement or operation, resolution easiness suitable for the exposure condition can be obtained by a simple method. Phase differences can be preferentially assigned to adjacent patterns that are more difficult to resolve, so a shifter arrangement with higher resolution can be realized. This allows improvement in efficiency of the semiconductor design operation and reduction in production cost.

According to the present invention, for the shifter arrangement of a design layout having a fixed phase, the phase can be assigned according to the priority without changing the fixed phase. For example, in designing a Levenson phase shift mask for a DRAM, phase assignment for a memory cell portion having periodicity which is hard to resolve is preferably manually made. For the remaining peripheral patterns, the phase is automatically assigned using the method of the present invention. In this case, shifters can be arranged on the peripheral patterns while maintaining the phases of patterns which were assigned manually at the memory cell portion. The pattern having a fixed phase is often required to have particularly strict dimensional accuracy or high resolution. When a pattern adjacent to the pattern with a fixed phase is preferentially set to have an opposite phase, the resolution of the end portion of the pattern with fixed phase can be improved. As described above, by combining the manual arrangement and automatic arrangement, a high-quality Levenson photomask can be efficiently designed.

Additional objects and advantages of the present invention will be set forth in the description which follows, and in part will be obvious from the description, or may be learned by practice of the present invention.

The objects and advantages of the present invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the present invention and, together with the general description assigned above and the detailed description of the preferred embodiments given below, serve to explain the principles of the present invention in which:

FIGS. 12A to 12C are views showing pattern extraction and simulation for an adjacent line segment pair L2–L15 shown in FIG. 3;

FIGS. 18A to 18C are views showing an example of a criterion for selecting a one-dimensional simulation or two-dimensional simulation;

FIG. 19 is a view showing another example of the criterion for selecting a one-dimensional simulation or two-dimensional simulation;

DETAILED DESCRIPTION OF THE INVENTION

A preferred embodiment of a photomask design method according to the present invention will now be described with reference to the accompanying drawings.

First Embodiment

Figure 1:
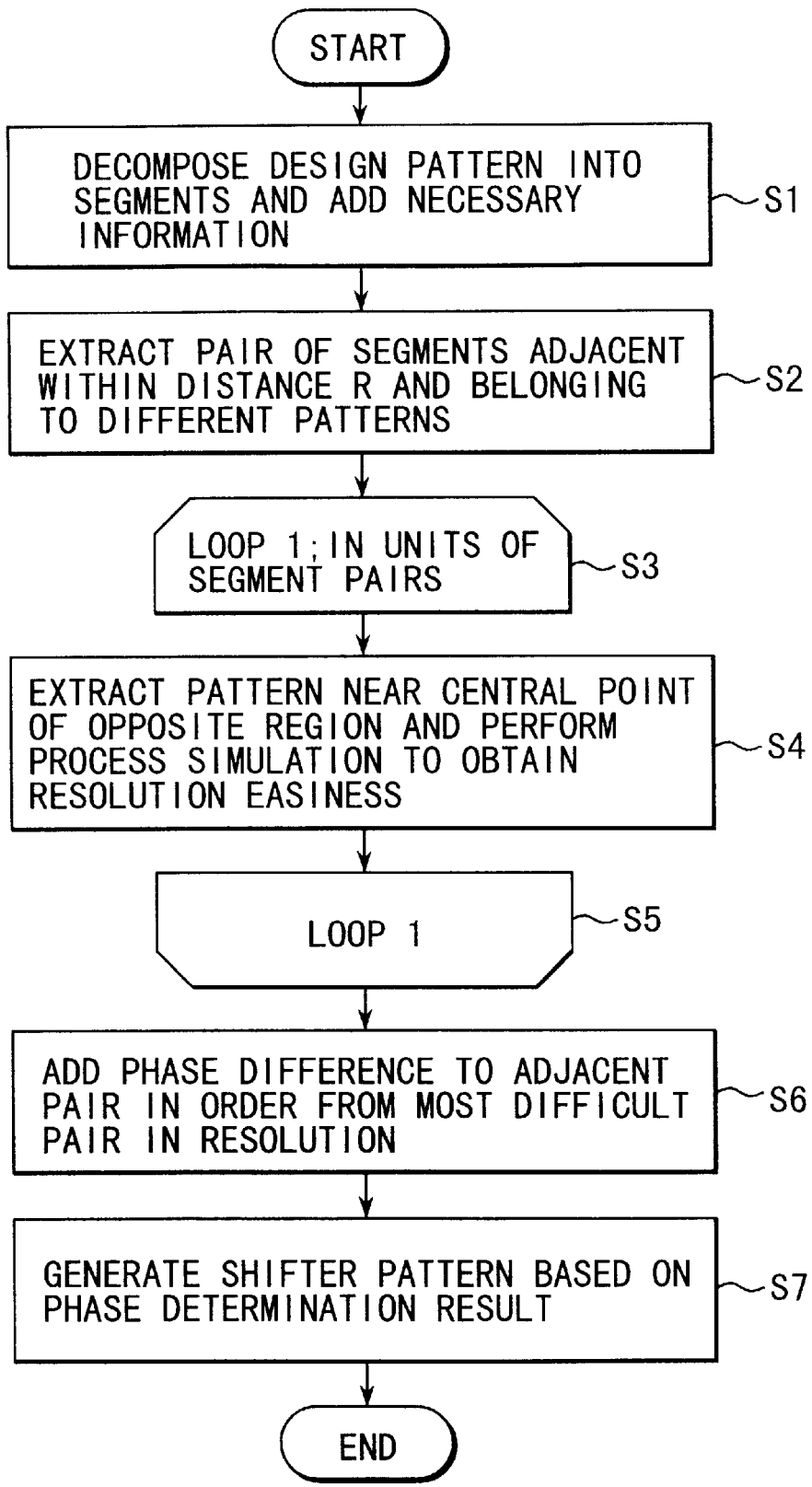
FIG. 1 is a flow chart showing the processing flow of a photomask design method according to the first embodiment of the present invention.

FIG. 1 is a flow chart showing a photomask design method according to the first embodiment of the present invention. The first embodiment is characterized in that a photomask design method of forming a plurality of opening patterns for passing incident light in a light-shielding film, on some patterns, phase shifters for giving a phase difference to the incident light transmitted through the patterns comprises the steps of decomposing patterns into line segments, extracting line segment pairs which are adjacent to each other within a predetermined distance R and belong to different patterns, obtaining for an each parts of line segments, a pattern within a predetermined distance S from the central position of an opposite region where the line segments oppose each other in a direction perpendicular to the line segments, obtaining resolution easiness using a process simulation, an experiment, or a combination thereof for the obtained pattern, the resolution easiness representing the easiness in resolving the line segments of the adjacent patterns, and determining a phase shifter arrangement to give a phase difference to the line segments of adjacent patterns in order of difficulty in resolution (in ascending order of resolution easiness). The resolution easiness has a large value if the resolution is easy and a small value if the resolution is difficult.

Figure 2:
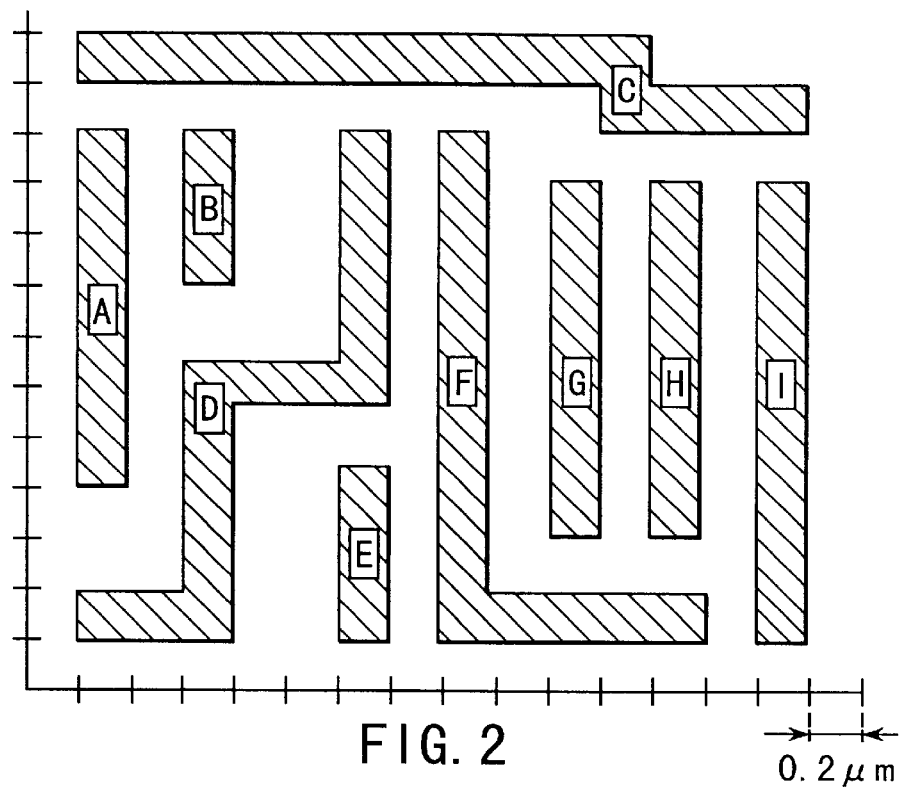
FIG. 2 is a view showing design layout data used in the first embodiment.

The operation will be described in accordance with the flow chart shown in FIG. 1 by exemplifying a case wherein a mask associated with a layout pattern shown in FIG. 2 is to be designed.

Figure 3:
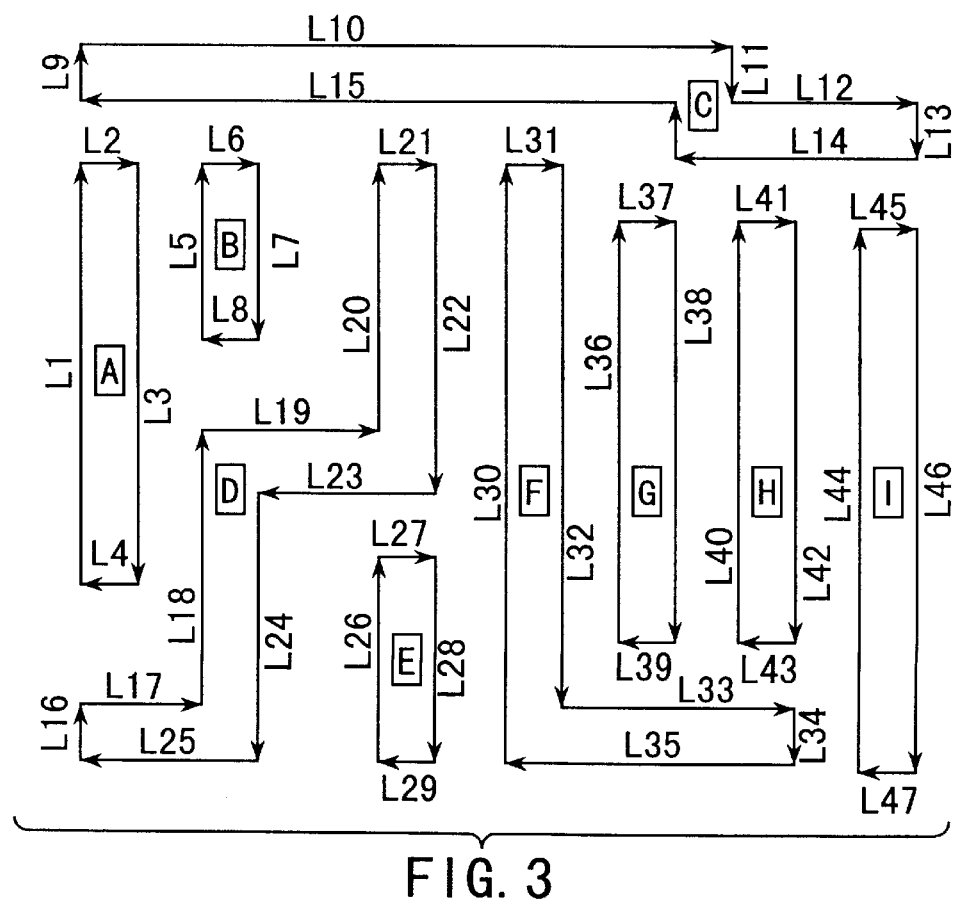
FIG. 3 is a view showing the pattern data shown in FIG. 2, which has been decomposed into line segments.

In the design layout having patterns A to I shown in FIG. 2, all patterns are decomposed to line segments, as shown in FIG. 3. Line segment numbers L1 to L47 are assigned to all line segments. Information of a pattern to which a certain line segment belongs is given as the attribute of the line segment (step S1).

A threshold design R for determining an adjacent line segment pair is set at 0.2 $\mu$m, and all line segment pairs each of which has line segments adjacent to each other and belonging to different patterns are extracted (step S2). Table 1 shows the extraction result. It is assumed that the resolution easiness is not affected as far as they are separated by 0.2 $\mu$m or more even when the same phase is assigned to adjacent patterns.

TABLE 1

| SEGMENT PAIR | OPPOSITE REGION LENGTH($\mu$m) |
|---|---|
| L2–L15 | 0.2 |
| L3–L5 | 0.6 |
| L3–L18 | 0.5 |
| L6–L15 | 0.2 |
| L14–L41 | 0.2 |
| L14–L45 | 0.2 |
| L15–L21 | 0.2 |
| L15–L31 | 0.2 |
| L22–L30 | 1.1 |
| L23–L27 | 0.2 |
| L28–L30 | 0.7 |
| L32–L36 | 1.4 |
| L33–L39 | 0.2 |
| L33–L43 | 0.2 |
| L34–L44 | 0.2 |

TABLE 1-continued

| SEGMENT PAIR | OPPOSITE REGION LENGTH($\mu$m) |
|---|---|
| L38–L40 | 1.4 |
| L42–L44 | 1.4 |

Next, patterns near each extracted line segment pair are extracted using the distance S, and a process simulation is performed to obtain resolution easiness representing the easiness in resolving the line segment pair (steps S3 to S5). As the process simulation, an exposure simulation, simulation up to development, simulation up to etching, or an arbitrary combination of these simulations can be selected.

In this embodiment, the exposure simulation is used. Not the simulation but an actual experiment may be conducted, or an experiment and simulation may be combined.

Some methods are available to extract patterns near a line segment pair of interest, which are to be input to the exposure simulator.

Figure 4:
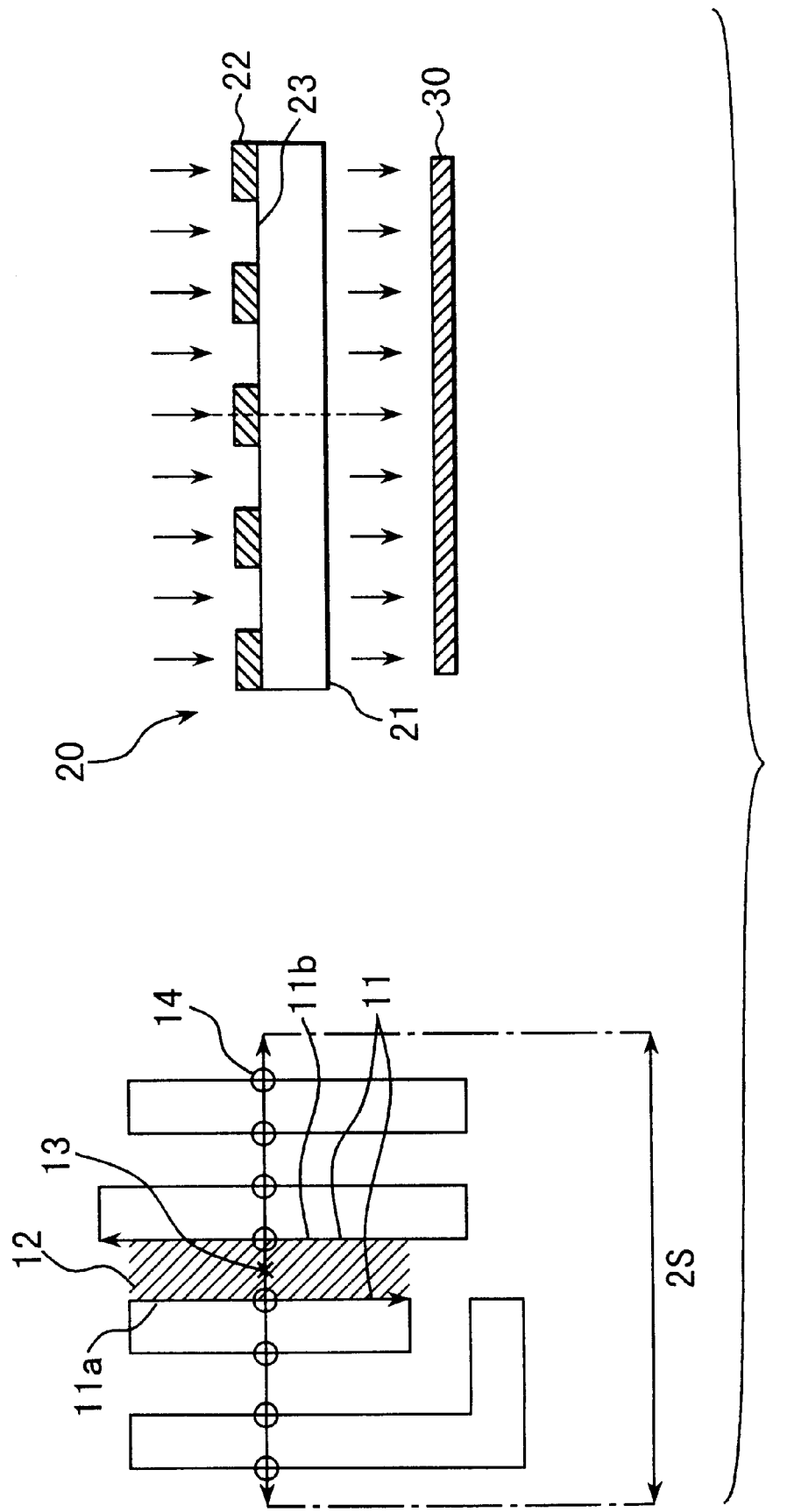
FIG. 4 is a view showing an example of a pattern extraction method in the first embodiment.

As the first extraction method, patterns within the distance S from the line segment pair of interest are one-dimensionally extracted. More specifically, as shown in FIG. 4, lines and spaces patterns within the distance S from a central point 13 of an opposite region 12 of a line segment pair 11a–11b of interest in a direction perpendicular to the line segments are obtained and subjected to a one-dimensional process simulation. It is also possible to simulate these obtained lines and spaces patterns by or with a two-dimensional process simulation.

In FIG. 4, reference numeral 14 denotes an edge point to be extracted; 20, a photomask; 21, a transparent substrate; 22, a light-shielding portion; 23, a transparent portion, and 30, a wafer. Light incident on the photomask 20 is partially coherent.

Figure 5:
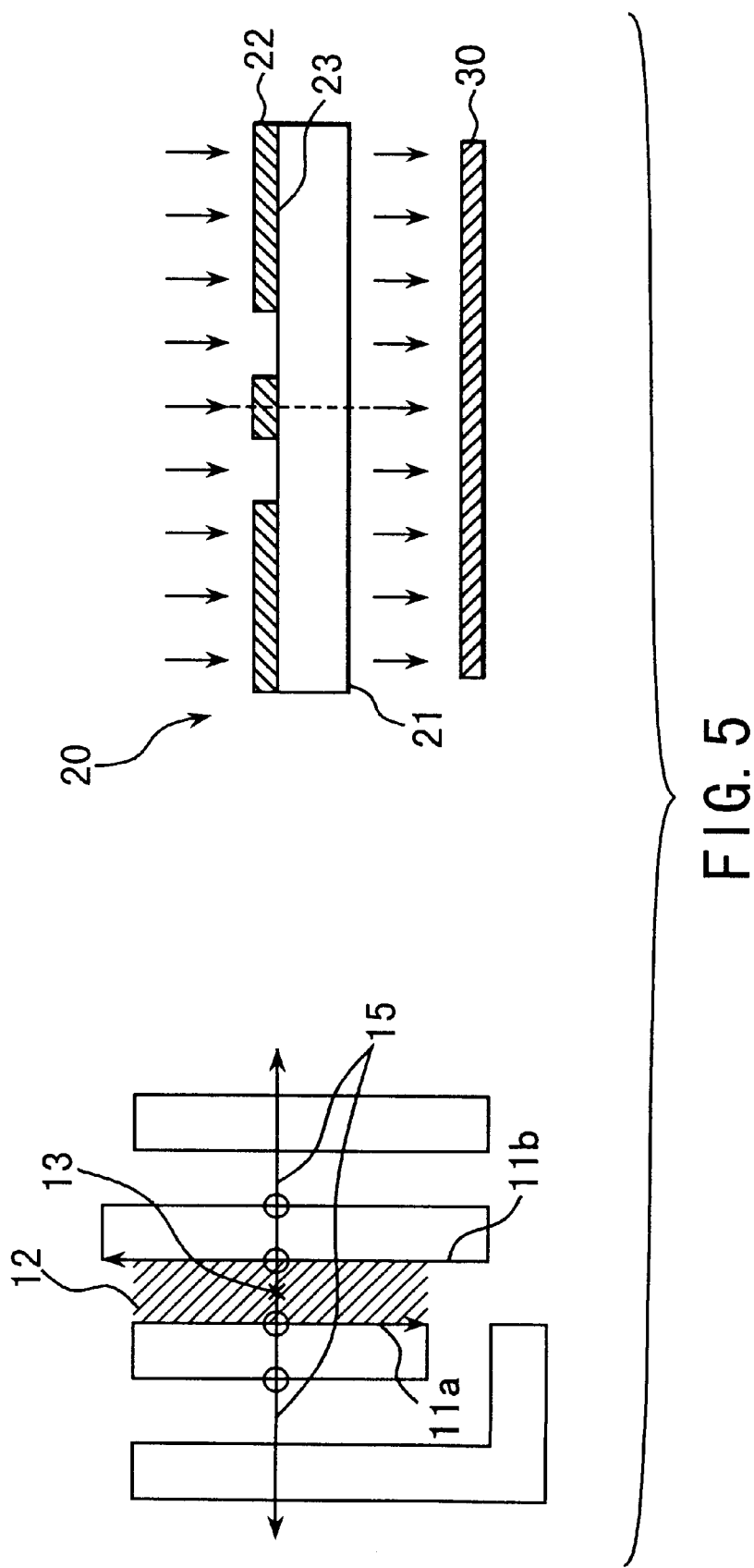
FIG. 5 is a view showing another example of the pattern extraction method in the first embodiment.

As the second extraction method, the first extraction method is simplified to extract only two patterns including the line segment pair of interest. More specifically, as shown in FIG. 5, two space patterns detected first from the central point 13 of the opposite region 12 of the line segment pair 11a–11b of interest in a direction perpendicular to the line segments are obtained and subjected to the one-dimensional process simulation. It is also possible to simulate these obtained patterns by or with a two-dimensional process simulation.

Figure 6:
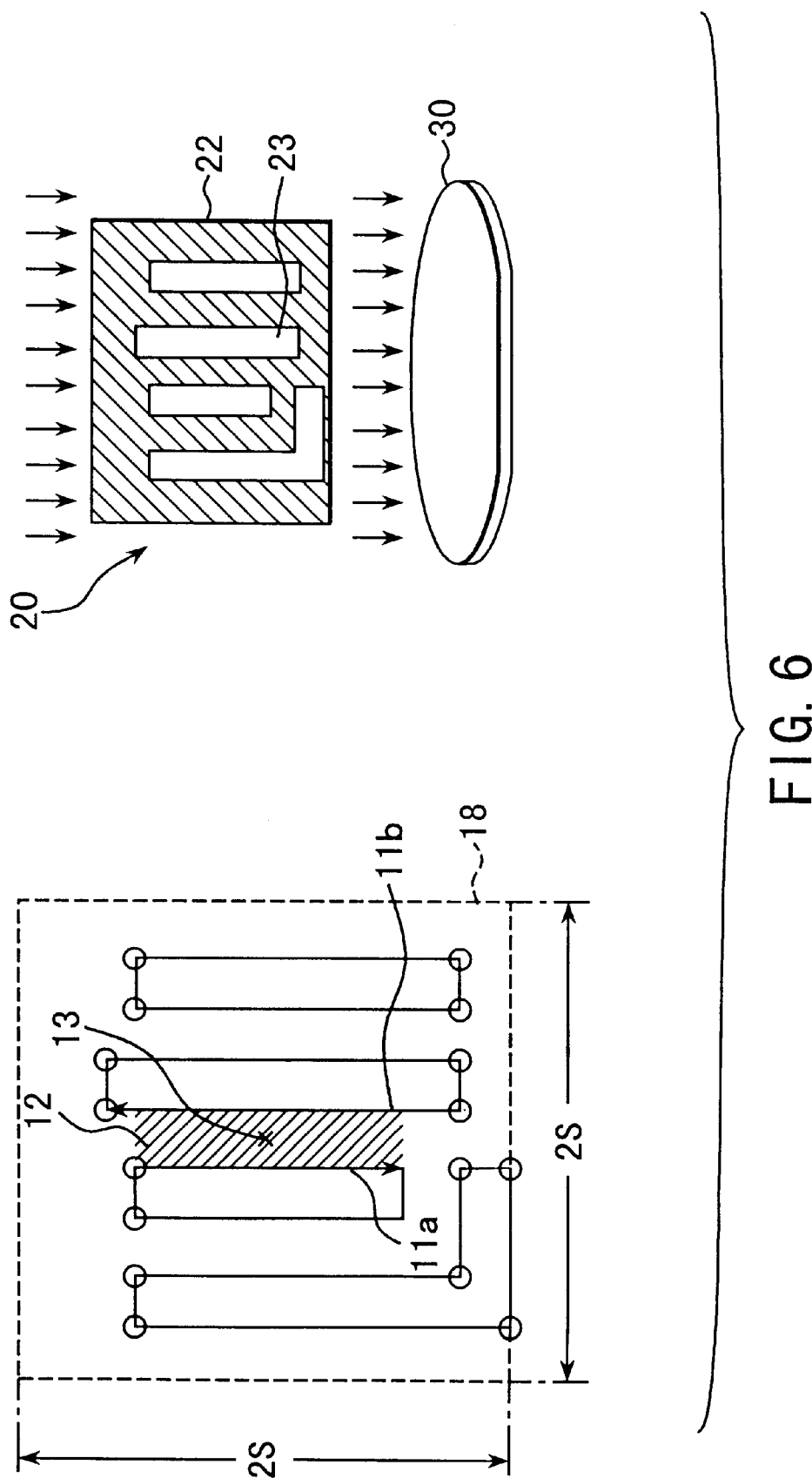
FIG. 6 is a view showing still another example of the pattern extraction method in the first embodiment.

As the third extraction method, patterns within the distance S from the line segment pair of interest are two-dimensionally extracted. More specifically, as shown in FIG. 6, patterns in a square region having a size of 2S×2S and centered on the central point 13 of the opposite region 12 of the line segment pair 11a–11b of interest are extracted and subjected to a two-dimensional process simulation.

The first and second methods are categorized to one-dimensional processing and the third method is categorized to two-dimensional processing.

Since the two-dimensional processing takes a longer time than the one-dimensional processing, the number of portions to be subjected to the two-dimensional processing is preferably made as small as possible. When the opposite region length is equal to or smaller than a distance T, the two-dimensional processing is performed; otherwise, the one-dimensional processing is applied.

In step S4, after pattern extraction, the resolution easiness of the line segment pair of interest is obtained from the exposure simulation result. The resolution easiness may be obtained not by the process simulation but by an experiment or a combination of an experiment and a simulation. Some methods are available to obtain the resolution easiness.

1: FIG. 7A

The extracted patterns are subjected to the exposure simulation to obtain a light intensity Ic at the central portion of the opposite region and light intensities Ia and Ib at the central positions of patterns to which the line segment pair of interest belongs. The light intensity Ic is subtracted from the smaller one of the light intensities Ia and Ib. If the light intensity at the central position of the opposite region does not match the minimal value of the light intensity, the minimal value of the light intensity may be used instead of the light intensity at the central position. If the light intensity at the pattern central position does not match the maximal value of the light intensity, the maximal value may be used. As the difference between Ic and Ia or Ib becomes large, it becomes easier to resolve the line segment pair.

2: FIG. 7B

The extracted patterns are subjected to the exposure simulation to obtain the light intensity Ic at the central portion of the opposite region and the light intensities Ia and Ib at the central positions of patterns to which the line segment pair of interest belongs. The light intensity Ic is subtracted from an average value Iav of the light intensities Ia and Ib. As the difference between Ic and Iav becomes large, it becomes easier to resolve the line segment pair.

3: FIG. 7C

The extracted patterns are subjected to the exposure simulation to obtain the light intensity Ic at the central portion of the opposite region. The light intensity Ic is subtracted from a slice level Is as a light intensity value for resolving a resist. As the difference between Ic and Is becomes large, it becomes easier to resolve the line segment pair. When the light intensity Ia or Ib at the central position of one of the patterns to which the line segment pair of interest belongs is smaller than the slice level, the light intensity Ic is subtracted not from the slice level Is but from the smaller value Ia or Ib. Alternatively, the average value of smaller two of the slice level Is and the light intensities Ia and Ib, or the average value of the three values may be obtained, and the light intensity Ic may be subtracted from the average value.

4: FIG. 7D

The extracted patterns are subjected to the exposure simulation to obtain tilt angles α1 and α2 (As the angle becomes large, it becomes easier to resolve the line segment pair) of tangents connected between the central portion of the opposite region and the central positions of the patterns to which the line segment pair of interest belongs. The smaller one of the values or the average value of the tilt angles α1 and α2 is obtained as the resolution easiness.

5: FIG. 8

Figure 8:
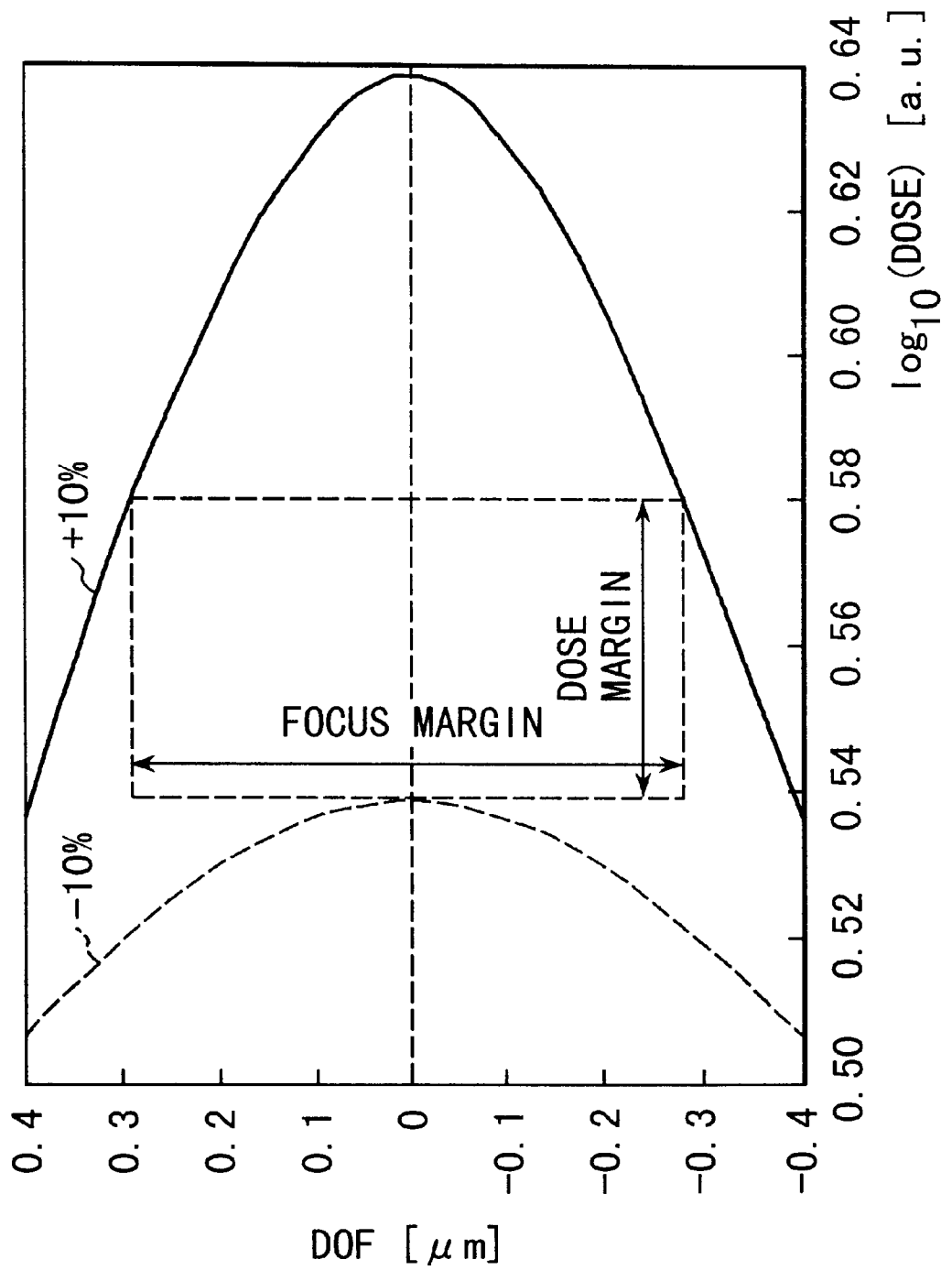
FIG. 8 is a graph showing another method of obtaining resolution easiness in the first embodiment.

The extracted patterns are subjected to some exposure simulations, e.g., at different defocus values. The interval between the patterns is measured in the simulation results to prepare a graph called an ED-tree as shown in FIG. 8. In this case, the ED-tree is formed within the range of "desired pattern size ±10%". The solid line indicates the characteristics for the "desired pattern size +10%", and the broken line indicates the characteristics for the "desired pattern size −10%". A FOCUS margin or DOSE margin is obtained from the ED-tree as the resolution easiness (As the margin becomes large, it becomes easier to resolve the line segment pair). Alternatively, the size of a FOCUS×DOSE window shown in FIG. 8 may be obtained as the resolution easiness by itself. In this case, a larger window size means easier resolving.

Others:

The resolution easiness is obtained by calculating a difference of a pattern dimension from a desired dimension using at least one of the process simulation and the experiment by changing a process parameter, and obtaining a process parameter margin at which a dimension difference falls within a predetermined range as the resolution easiness. The larger margin of the process parameter means easier resolving.

Figure 7A:
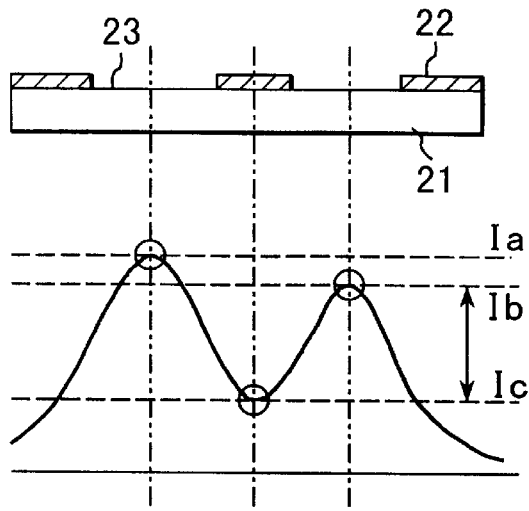
FIGS. 7A to 7D are views showing a method of obtaining resolution easiness in the first embodiment.
Figure 7B:
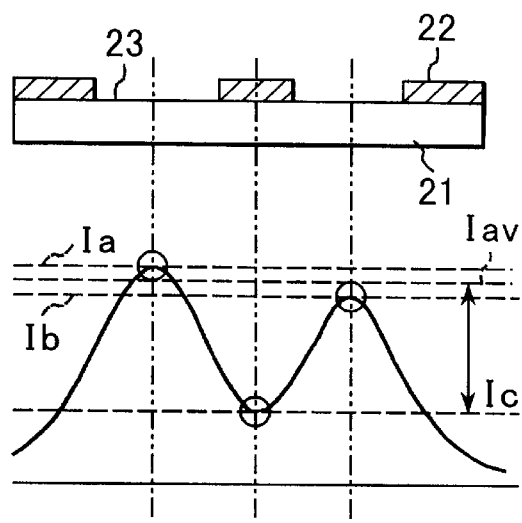
Figure 7C:
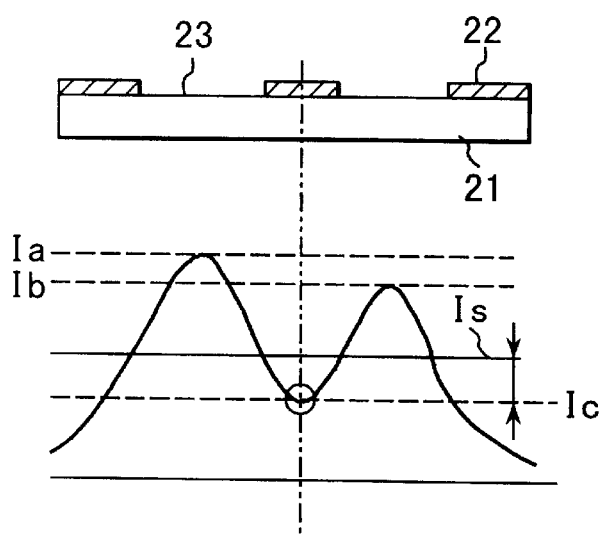
Figure 7D:
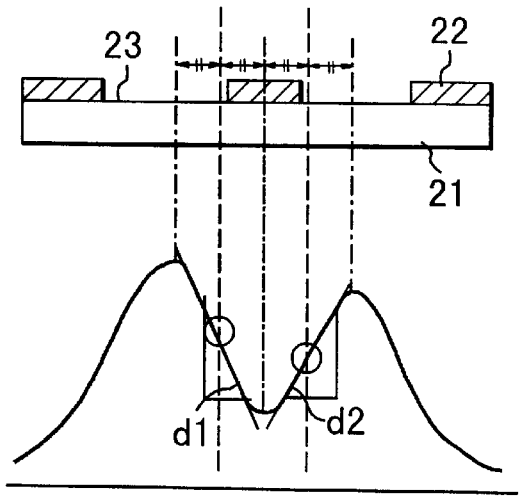
Figure 9:
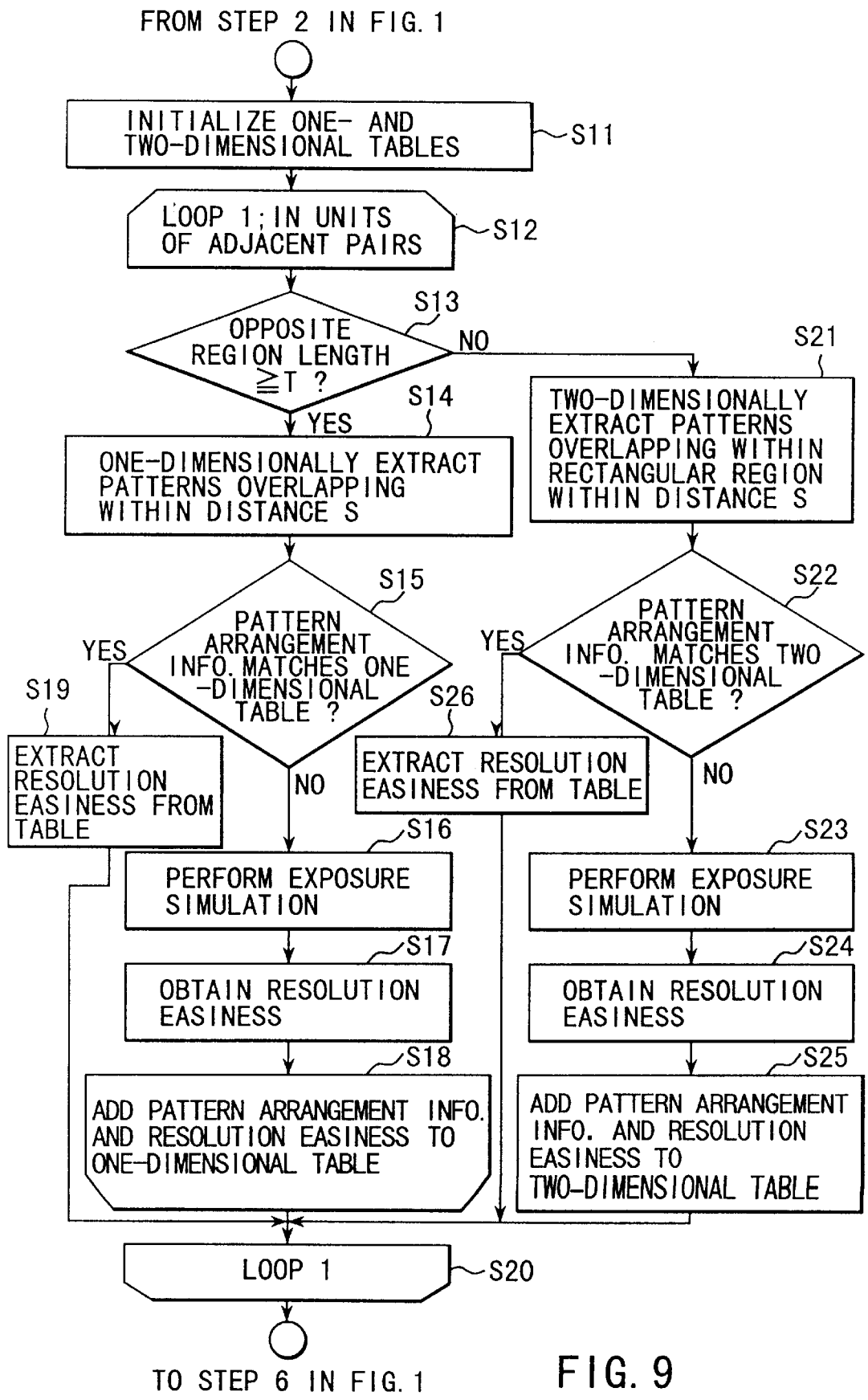
FIG. 9 is a flow chart showing details of the processing flow in steps S3 to S5 shown in FIG. 1 in which patterns near a line segment pair are extracted, and a process simulation is performed to obtain resolution easiness.

The operation of obtaining the resolution easiness of each line segment pair in steps S3 to S5 shown in FIG. 1 will be described next in detail. In this case, the pattern extraction method shown in FIG. 4 or 6 is used, and the resolution easiness calculation method shown in FIG. 7C is used, although the present invention is not limited to these methods. FIG. 9 shows details of the flow in steps S3 to S5. In this embodiment, for the purpose of increasing the processing speed, the resolution easiness and pattern arrangement information near a line segment pair of interest are paired and stored in a table. For a line segment pair having the same pattern arrangement information as that of a pair whose resolution easiness has already been obtained, the table is looked up not to repeat the process simulation for the same pattern. This processing will be briefly described. The first pattern is extracted, and the resolution easiness is obtained by a process simulation or experiment and added to the lookup table. When the next pattern is extracted, the table is looked up to determine whether pattern arrangement information coinciding with the information of the next pattern is registered in the table. If the same pattern arrangement information is present, the resolution easiness is obtained based on the table without performing the process simulation. If no pattern arrangement information coincides with the pattern arrangement information, the resolution easiness is obtained by the process simulation and added to the table, like the first pattern.

More specifically, in step S11, a one-dimensional table and a two-dimensional table are initialized. In step S12, an adjacent line segment pair (line segment pair of interest) is selected, and it is determined in step S13 whether the opposite region length is equal to or larger than the distance T.

If YES in step S13, the flow advances to step S14 to perform the one-dimensional processing. If NO in step S13, the flow advances to step S21 to perform the two-dimensional processing. In this case, the distance T is set at 0.2 μm. In step S14, patterns near the line segment pair of interest are extracted. In this case, as shown in FIG. 4, lines and the spaces within the distance S from the central point 13 of the line segment pair 11a–11b of interest in the direction perpendicular to the line segments are extracted.

In step S15, it is determined whether the pattern arrangement information (the coordinate values of pattern edge points positioned on a straight line which is perpendicular to the line segments and centered on the central point of the opposite region) of the extracted patterns has already been registered in the one-dimensional table. If NO in step S15, the flow advances to step S16 to perform the exposure simulation, thereby obtaining the light intensity. In step S17, the resolution easiness is calculated. In this case, the resolution easiness is obtained by the method shown in FIG. 7C.

In step S18, the pattern arrangement information and resolution easiness of the extracted pattern are added to the one-dimensional table. If YES in step S15, the flow advances to step S19 to read out resolution easiness corresponding to the pattern arrangement information from the table.

Figure 10A:
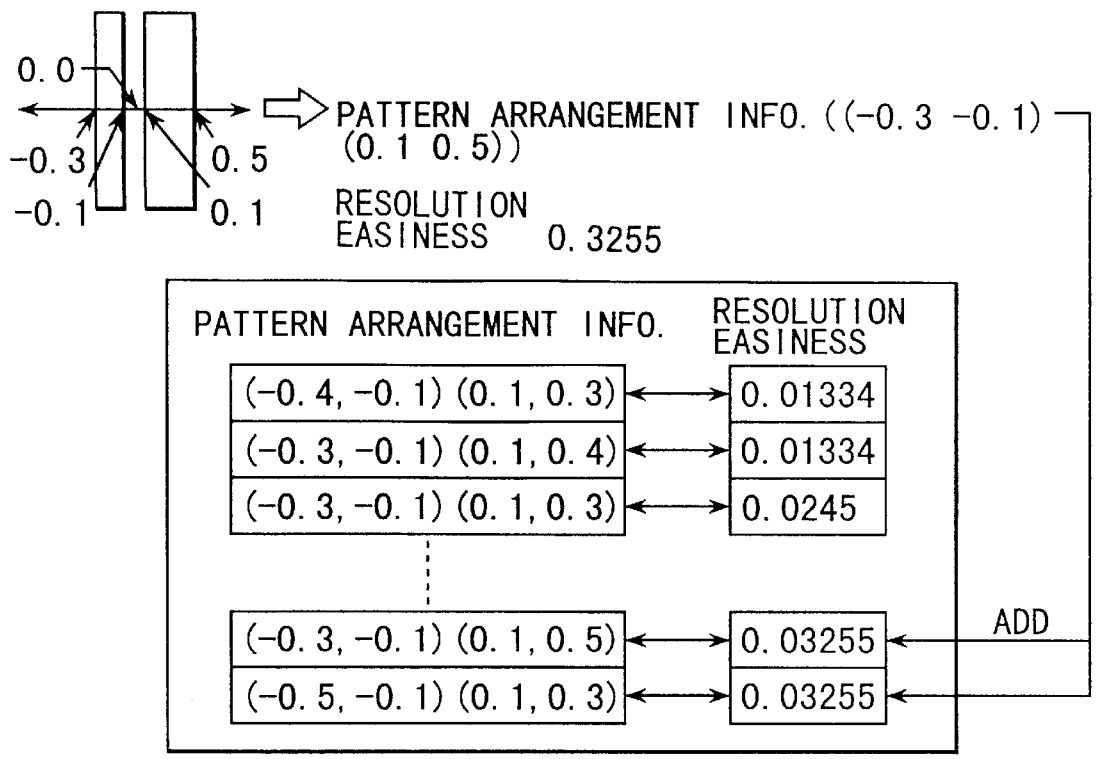
FIGS. 10A and 10B are views showing registration and look-up methods for one-dimensional table.
Figure 10B:
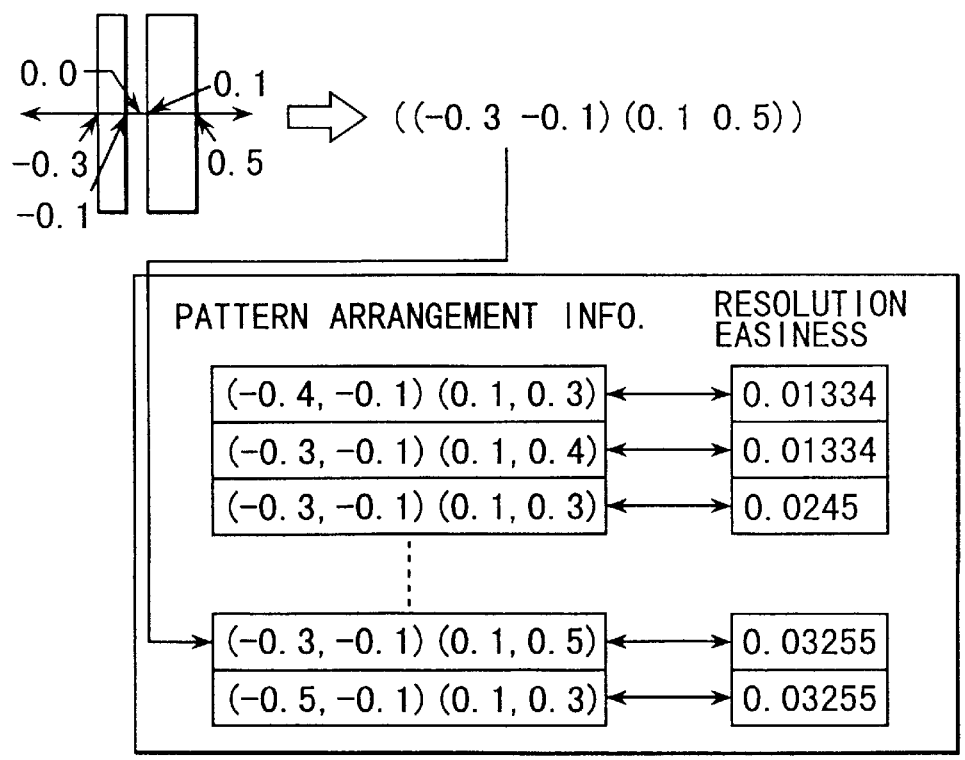

FIG. 10A shows a method of storing data in the one-dimensional table. The pattern edge array is represented by coordinate values relative to the origin (0,0) at the central position of the opposite region as pattern arrangement information. This pattern arrangement information and resolution easiness corresponding to the pattern arrangement information are paired and stored in the table. Even when the one-dimensional pattern array is reversed in the horizontal direction, the resolution easiness does not change, as shown in FIGS. 7A to 7D and 8, so pattern arrangement information corresponding to the reversed array is also stored. When the table is looked up, resolution easiness corresponding to the pattern arrangement information is extracted, as shown in FIG. 10B.

Referring back to FIG. 9, if NO in step S13, the flow advance to step S21 to extract patterns near the line segment pair of interest. In this case, as shown in FIG. 6, patterns within the square region having a size of 2S×2S and centered on the central point 13 of the opposite region 12 of the line segment pair 11a–11b of interest are extracted in step S21.

Figure 11:
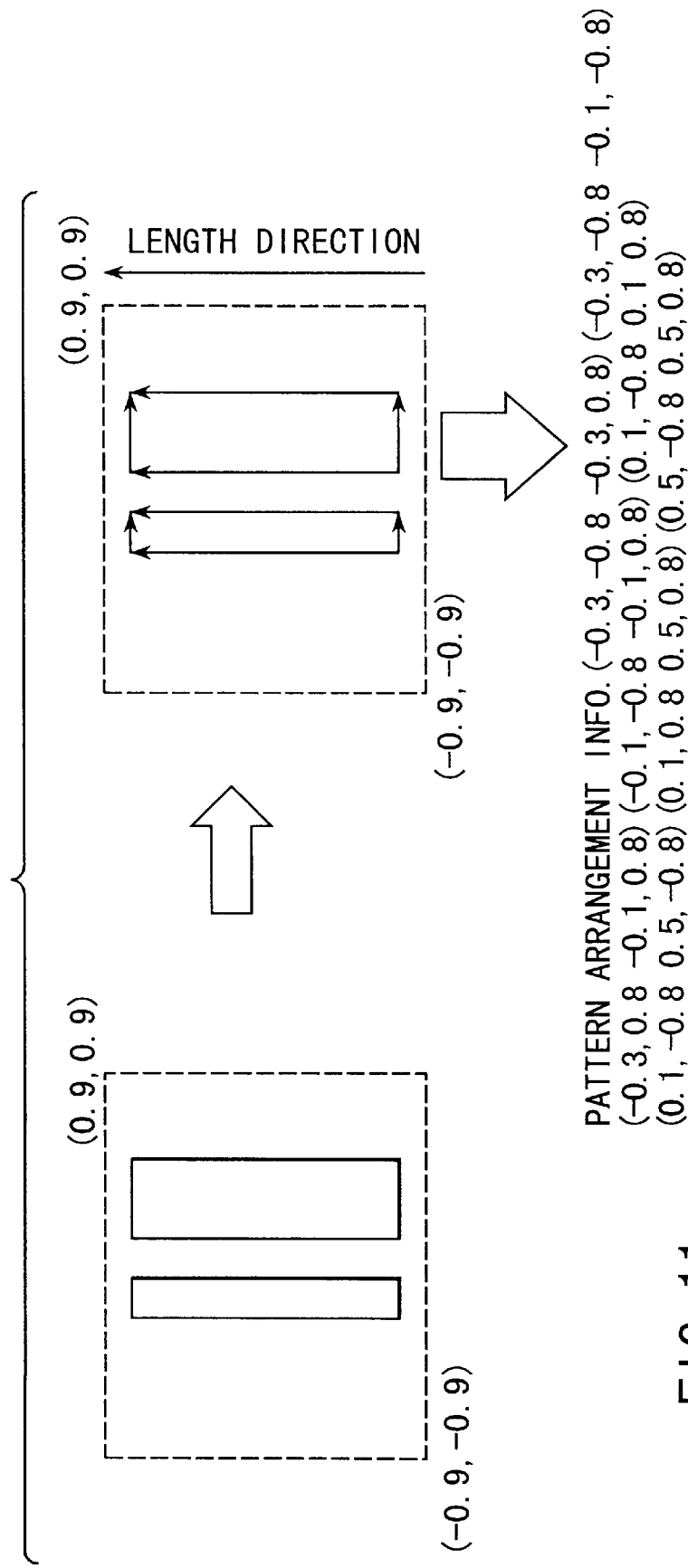
FIG. 11 is a view showing a two-dimensional table preparation method.

In step S22, the pattern arrangement information of the extracted patterns is checked. The pattern arrangement information of extracted patterns for the two-dimensional processing is obtained by decomposing the extracted patterns into line segments and sorting the line segments by setting, as the first key, the ascending order in a direction perpendicular to the longitudinal direction of the opposite region and as the second key, the ascending order in a direction parallel to the longitudinal direction of the opposite region, as shown in FIG. 11, so that a set of line segment information sets is obtained as the pattern arrangement information. It is determined whether the pattern arrangement information has already been registered in the two-dimensional table. If NO in step S22, the flow advances to step S23 to perform the exposure simulation, thereby obtaining the light intensity. In step S24, the resolution easiness is obtained.

In step S25, the pattern arrangement information and resolution easiness of the extracted patterns are added to the two-dimensional table. The table storage and look-up methods are the same as those for the one-dimensional table shown in FIGS. 10A and 10B except the format of pattern arrangement information. Patterns obtained by mirror-inversion about an axis along the longitudinal direction of the opposite region have the same resolution easiness so that these patterns are also added to the table. If YES in step S22, the flow advances to step S26 to read out resolution easiness corresponding to the pattern arrangement information from the table.

The above operation (steps S12 to S20) is performed for all line segment pairs.

The operation of extracting patterns, performing the process simulation, and evaluating the resolution easiness (steps S17, S24, and the like in FIG. 9) will be described next in detail. Table 1 shows the line segment pairs and the lengths of the opposite regions shown in FIG. 1.

In this embodiment, the opposite region length T used to determine the one-dimensional or two-dimensional processing is set at 0.2 $\mu$m, and the distance S which defines the pattern extraction range (for both one-dimensional and two-dimensional) is set at 0.6 $\mu$m (the distance S is preferably designated within the range of optical proximity effect). As the exposure conditions, normal illumination is used as the light source, the wavelength $\lambda$ is 0.248 $\mu$m, the coherence factor $\sigma$ is 0.3, the numerical aperture NA is 0.55, the defocus value is 0.3 $\mu$m, and the slice level is 0.3. After a line segment pair is extracted, the extracted line segment pair is subjected to the exposure simulation.

For the first line segment pair L2–L15 of interest shown in Table 1, the opposite region length is 0.2 $\mu$m and smaller than the distance T. In this case, patterns within the square region having a size of 2S×2S=1.2 $\mu$m×1.2 $\mu$m and centered on a central position O of the opposite region are two-dimensionally extracted, as shown in FIG. 12A.

The extracted patterns are subjected to the exposure simulation to obtain a light intensity distribution along a vertical line (alternate long and short dashed line) from the center O of the opposite region of the line segments of interest, as shown in FIG. 12B. FIG. 12C shows the result.

The light intensity Ic at the central position O of the opposite region 12 is 0.091737.

Therefore, the resolution easiness value is Is–Ic=0.3–0.091737=0.208263. The pattern arrangement information and resolution easiness of the extracted patterns are added to the two-dimensional table. The resolution easiness may be determined while defining easier resolving as the light intensity at the central position of the opposite region is lower.

Figure 13A:
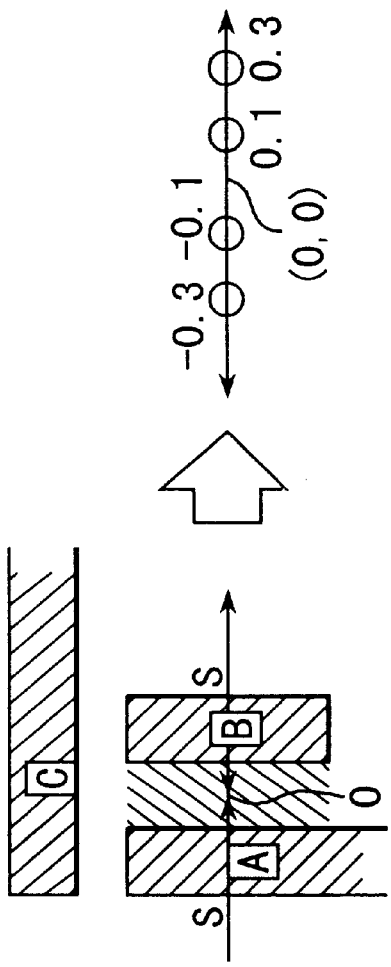
FIGS. 13A and 13B are views showing pattern extraction and simulation for an adjacent line segment pair L3–L5 shown in FIG. 3.
Figure 13B:
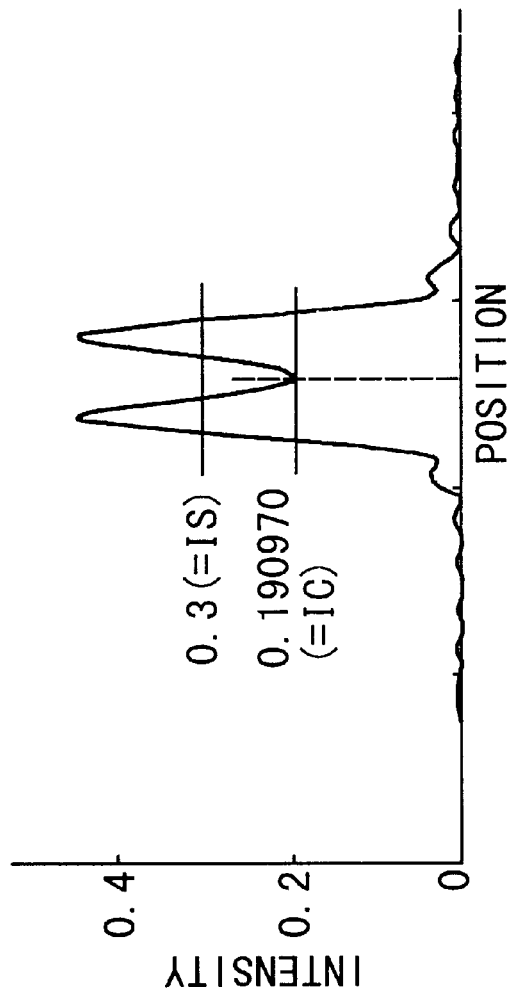

For the second line segment pair L3–L5 of interest in Table 1, the opposite region length is 0.6 $\mu$m which is greater than the distance T. In this case, patterns separated from the central point of the opposite region by the distance S or less are one-dimensionally extracted and subjected to the one-dimensional exposure simulation, as shown in FIG. 13A. The result is shown in FIG. 13B.

Since the light intensity Ic at the central position O of the opposite region is 0.190970, the resolution easiness is Is–Ic=0.3–0.190970=0.10903. The currently extracted pattern (–0.3, –0.1) (0.1, 0.3) and a pattern obtained by inverting it in the horizontal direction, i.e., (–0.3, –0.1)(0.3, 0.1) are added to the one-dimensional table in correspondence with the resolution easiness. In this case, however, the inverted pattern is the same as the original pattern, so the inverted pattern is not added. Table 2 shows the one-dimensional table at this time point.

TABLE 2

| INDEX: PATTERN ARRANGEMENT INFO. | RESOLUTION EASINESS |
|---|---|
| (–0.3, –0.1)(0.1, 0.3) | 0.10903 |

Figure 14:
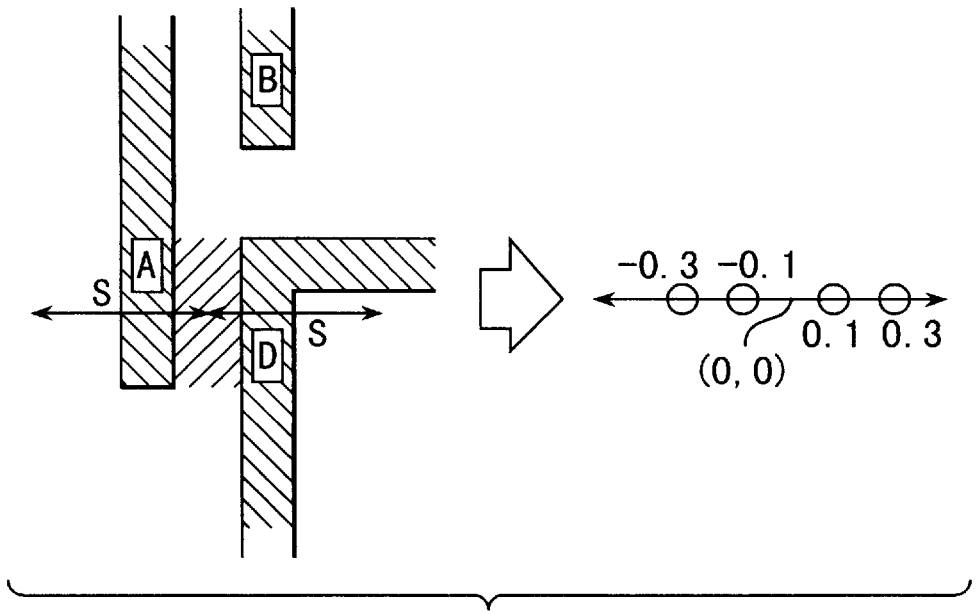
FIG. 14 is a view showing pattern extraction for an adjacent line segment pair L3–L18 shown in FIG. 3.

For the third line segment pair L3–L18 of interest in Table 1, the opposite region length is 0.5 $\mu$m and larger than the distance T. In this case, as shown in FIG. 14, patterns within the distance S from the central point of the opposite region are one-dimensionally extracted and subjected to the one-dimensional exposure simulation. The extracted pattern arrangement information is (–0.3, –0.1)(0.1, 0.3). It is checked with reference to the one-dimensional table shown in Table 2 whether a similar pattern has already been simulated. In this case, (–0.3, –0.1)(0.1, 0.1) is found by the table search, so the corresponding resolution easiness "0.10903" is obtained without performing the simulation.

This processing is performed for all line segment pairs in Table 1 following the above procedure, and a result shown in Table 3 is obtained. The light intensity Ic at the central point of the opposite region and the light intensities Ia and Ib at the central points of the adjacent patterns are also described.

TABLE 3

| SEGMENT PAIR | INTENSITY Ia | INTENSITY Ib | INTENSITY Ic | RESOLUTION EASINESS |
|---|---|---|---|---|
| L2–L15 | 0.337571 | 0.540008 | 0.091737 | 0.208263 |
| L3–L5 | 0.440914 | 0.440914 | 0.190970 | 0.109030 |
| L3–L18 | 0.440914 | 0.440914 | 0.190970 | 0.109030 |
| L6–L15 | 0.501465 | 0.586072 | 0.113290 | 0.186710 |
| L14–L41 | 0.553764 | 0.432513 | 0.101730 | 0.198270 |
| L14–L45 | 0.343897 | 0.539745 | 0.092393 | 0.207607 |
| L15–L21 | 0.501465 | 0.586072 | 0.113290 | 0.186710 |
| L15–L31 | 0.507834 | 0.494977 | 0.112232 | 0.187768 |
| L22–L30 | 0.441753 | 0.365500 | 0.191640 | 0.108360 |
| L23–L27 | 0.587291 | 0.578310 | 0.071067 | 0.228933 |
| L28–L30 | 0.440914 | 0.440914 | 0.190970 | 0.109030 |
| L32–L36 | 0.365489 | 0.365489 | 0.191368 | 0.108632 |
| L33–L39 | 0.442687 | 0.463511 | 0.104827 | 0.195173 |
| L33–L43 | 0.429616 | 0.279606 | 0.070024 | 0.229976 |
| L34–L44 | 0.602159 | 0.337683 | 0.093025 | 0.206975 |
| L38–L40 | 0.365489 | 0.365489 | 0.191368 | 0.108632 |
| L42–L44 | 0.365500 | 0.441753 | 0.191640 | 0.108360 |

Table 3 contains data of line segment pairs, while Table 4 below contains the data of adjacent pattern pairs.

TABLE 4

| DATA STORAGE ORDER | ADJACENT PATTERN PAIR | RESOLUTION EASINESS (SEGMENT PAIR) |
|---|---|---|
| 1 | A-B | 0.109030(L3–L5) |
| 2 | A-C | 0.208263(L2–L15) |
| 3 | A-D | 0.109030(L3–L18) |
| 4 | B-C | 0.186710(L6–L15) |
| 5 | C-D | 0.186710(L15–L21) |
| 6 | C-F | 0.187768(L15–L31) |
| 7 | C-H | 0.198270(L14–L41) |
| 8 | C-I | 0.207607(L14–L45) |
| 9 | D-E | 0.228933(L23–L27) |
| 10 | D-F | 0.108360(L22–L30) |
| 11 | E-F | 0.109030(L28–L30) |
| 12 | F-G | 0.108632(L32–L36) |
|  |  | 0.195173(L33–L39) |
| 13 | F-H | 0.229976(L33–L43) |
| 14 | F-I | 0.206975(L34–L44) |
| 15 | G-H | 0.108632(L38–L40) |
| 16 | H-I | 0.108360(L42–L44) |

When a plurality of adjacent line segment pairs are included in one adjacent pattern pair (adjacent pattern pair F-G in Table 4), the adjacent line segment pairs are sorted in order of difficulty in resolution (in ascending order of resolution easiness).

Next, the adjacent pattern pairs are sorted in ascending order of resolution easiness (in order of difficulty in resolution). In comparison between the adjacent pattern pairs F-G and G-H, both pattern pairs have the same resolution easiness for their first adjacent line segment pairs. However, the adjacent pattern pair F-G has one more element L33–L39. In this case, the adjacent pattern pair F-G having a larger number of adjacent line segment pairs has higher priority. If the two adjacent pattern pairs have the same number of adjacent line segment pairs and the same resolution easiness, priority is assigned based on an element such as the length of adjacent sides, although a description thereof will be omitted in this embodiment. Table 5 below shows the sorting result.

TABLE 5

| DATA STORING ORDER | ADJACENT PATTERN PAIR | RESOLUTION EASINESS (SEGMENT PAIR) |
|---|---|---|
| 1 | D-F | 0.108360(L22–L30) |
| 2 | H-I | 0.108360(L42–L44) |
| 3 | F-G | 0.108632(L32–L36) |
|  |  | 0.195173(L33–L39) |
| 4 | G-H | 0.108632(L38–L40) |
| 5 | E-F | 0.109030(L28–L30) |
| 6 | A-D | 0.109030(L3–L18) |
| 7 | A-B | 0.109030(L3–L5) |
| 8 | C-D | 0.186710(L15–L21) |
| 9 | B-C | 0.186710(L6–L15) |
| 10 | C-F | 0.187768(L15–L31) |
| 11 | C-H | 0.198270(L14–L41) |
| 12 | F-I | 0.206975(L34–L44) |
| 13 | C-I | 0.207607(L14–L45) |
| 14 | A-C | 0.208263(L2–L15) |
| 15 | D-E | 0.228933(L23–L27) |
| 16 | F-H | 0.229976(L33–L43) |

Figure 15:
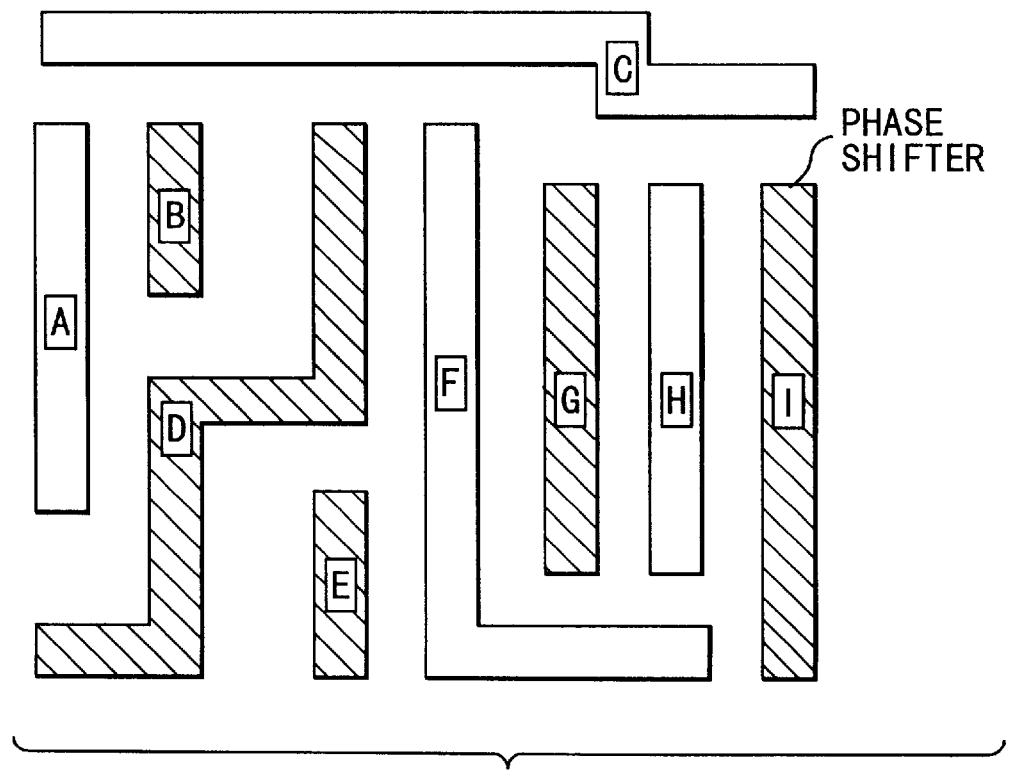
FIG. 15 is a view showing a phase shifter arrangement result obtained by the design method of the first embodiment.

Subsequently, the pattern pairs are assigned phase differences in the order shown in Table 5 (step S6 in FIG. 1). Various methods can be used to apply phase differences in accordance with the priority levels of the adjacent pairs. In this case, the phase is assigned by a method which is described in a copending U.S. patent application Ser. No. 08/622,411 filed by the present inventors. In this method, a graph is constructed in which nodes corresponds to a pattern, and each sides represents the phase reversal relationship. Firstly, two pattern pairs are sequentially connected to each other in an order shown in Table 5 while inhibiting connection if a closed loop is formed. At last, the node graph without a loop is created. An initial phase is assigned to the one of the nodes of the graph. A phase of each node is sequentially assigned along the graph to set a phase difference between adjacent nodes at 180°. Therefore, the phase inconsistency is not included in the high priority pair. FIG. 15 shows the phase assignment result. In FIG. 15, one of the pairs, which is assigned a phase difference, has a shifter for giving the phase difference (step S7 in FIG. 1).

As described above, according to this embodiment, a shifter arrangement with higher resolution can be realized for a Levenson phase shift mask. For this reason, the efficiency of semiconductor design operation can be improved, resulting in a reduction in production cost.

In the first embodiment, a pattern is decomposed into line segments in units of straight line portions, as shown in FIG. 3. However, in some cases, the resolution easiness can be accurately evaluated by more finely decomposing the patterns.

Figure 16:
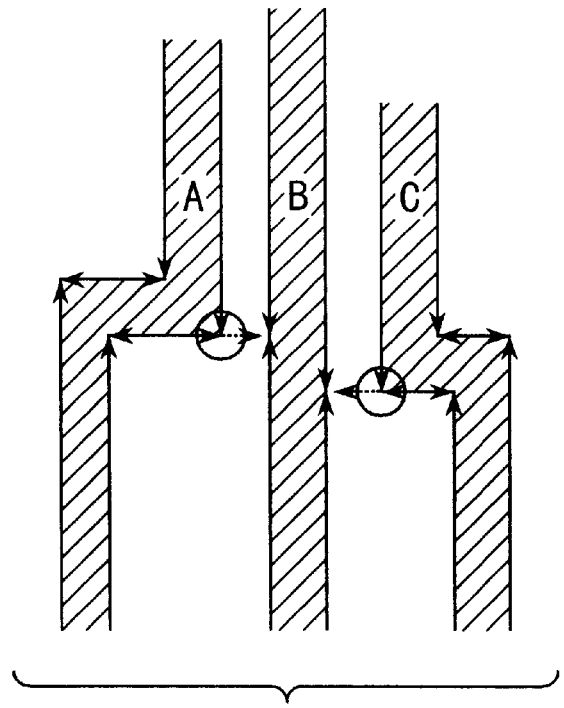
FIG. 16 is a view showing an example of a line segment dividing method.

FIG. 16 is a view showing a method of dividing line segments. An adjacent pattern within a specific distance from a line segment of interest in a direction perpendicular to the line segment of interest will be considered. A perpendicular line is dropped from the vertex of the adjacent pattern, which opposes the pattern including the line segment of interest, to the line segment of interest, and the line segment of interest is divided at the intersection point or near the intersection point not to make the length of each line segment after division smaller than a predetermined length. More specifically, division of line segments on the pattern B will be described. The line segments are divided at the vertex of the patterns A and C opposing the pattern B within a predetermined distance in the direction perpendicular to the pattern B (or the point at which the pattern arrangement is changed). Such a line segment division method can flexibly cope with the various pattern arrangement.

Figure 17:
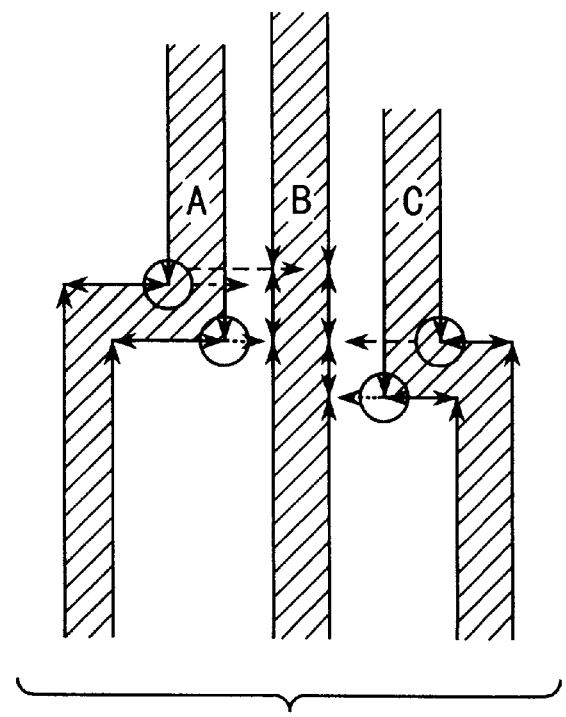
FIG. 17 is a view showing another example of the line segment dividing method.

FIG. 17 is a view showing another division method. An adjacent pattern within a specific distance from a line segment of interest in a direction perpendicular to the line segment will be considered. Perpendicular lines are dropped from not only the vertices of the adjacent patterns B and C opposing the pattern B within a predetermined distance in the direction perpendicular to the pattern B but also the other vertexes of the patterns A and B. The line segment of interest is divided at or near the intersection points not to make the length of each line segment after division smaller than a predetermined length. More specifically, the line segments are divided not only at points corresponding to the opposite sides but also at points at which the pattern arrangement environment changes within a predetermined distance in the direction perpendicular to the pattern B. Such a line segment division method can flexibly cope with a complex pattern arrangement.

In the first embodiment, determination whether the one-dimensional process or two-dimensional process is to be performed is made based on whether the opposite region length is equal to or larger than the distance T. However, the determination criterion is not limited to this. As shown in FIGS. 18A to 18C, when an adjacent line segment within a predetermined distance in a direction perpendicular to the longitudinal length direction of the opposite region from the opposite region is placed in a direction neither perpendicular nor parallel to the line segment of interest, the pattern including the line segment of interest may be two-dimensionally extracted. For a pattern shown in FIG. 18A, it is determined that the opposite region A1 cannot be one-dimensionally approximated. In this case, as shown in FIG. 18B, a rectangular region defined by lines within distances S1, S2, S3, and S4 from the opposite region A1 respectively in the horizontal and vertical directions is extracted as a pattern extraction region. As shown in FIG. 18C, this rectangular region is subjected to the two-dimensional process simulation to obtain the resolution easiness. FIG. 18C shows the distribution of the light intensity.

As still another determination criterion, when at least one of the line segment pair of interest is placed in a direction neither perpendicular nor parallel to the mask data design coordinate axes, the pattern included in a region centered at the center of the opposite region between the line segment pair of interest may be two-dimensionally extracted. Of the object line segments L1 to L8 in the layout shown in FIG. 19, the line segments L5 and L6 are placed in a direction neither perpendicular nor parallel to the mask coordinate axes. Since the line segments L2 and L5 are of interest, the pattern included in a region centered at the center of the opposite region between the line segment pair of interest are subjected to the two-dimensional process simulation to obtain the resolution easiness.

The respective steps of the flow chart shown in FIG. 1 may be replaced with functional blocks for performing the corresponding steps, and these functional blocks may be connected to constitute a photomask design apparatus. Actually, this apparatus is implemented by a computer whose operation is controlled by a program loaded from a recording medium such as a magnetic disk.

Second Embodiment

The second embodiment is characterized in that a photomask design method of forming a plurality of opening patterns for passing incident light in a light-shielding film, and arranging, on some patterns, phase shifters for giving a phase difference to the incident light transmitted through the patterns comprises the steps of extracting an adjacent pattern pair within a predetermined distance R, and decomposing each pattern into line segments, obtaining a pattern within a distance S from the central position of an opposite region in a direction perpendicular to the line segments, the opposite region being expected to be most difficult to resolve, obtaining resolution easiness representing the easiness in resolving the adjacent patterns using a process simulation, an experiment, or a combination thereof for the obtained pattern, and arranging phase shifters based on the obtained resolution easiness of the patterns adjacent within the distance R to give a phase difference in ascending order of resolution easiness (in order of difficulty in resolution).

This embodiment is basically the same as the first embodiment except the following point. In the first embodiment, all adjacent line segment pairs belonging to different patterns are extracted. In the second embodiment, however, only one of line segment pairs of adjacent pattern pair, which has the lowest resolution easiness, is extracted. As a method of determining the line segment pair of the adjacent pattern pair, which has the lowest resolution easiness, an adjacent line segment pair which has the longest adjacent opposite region within a distance V may be determined as the line segment pair having the lowest resolution easiness.

Figure 20:
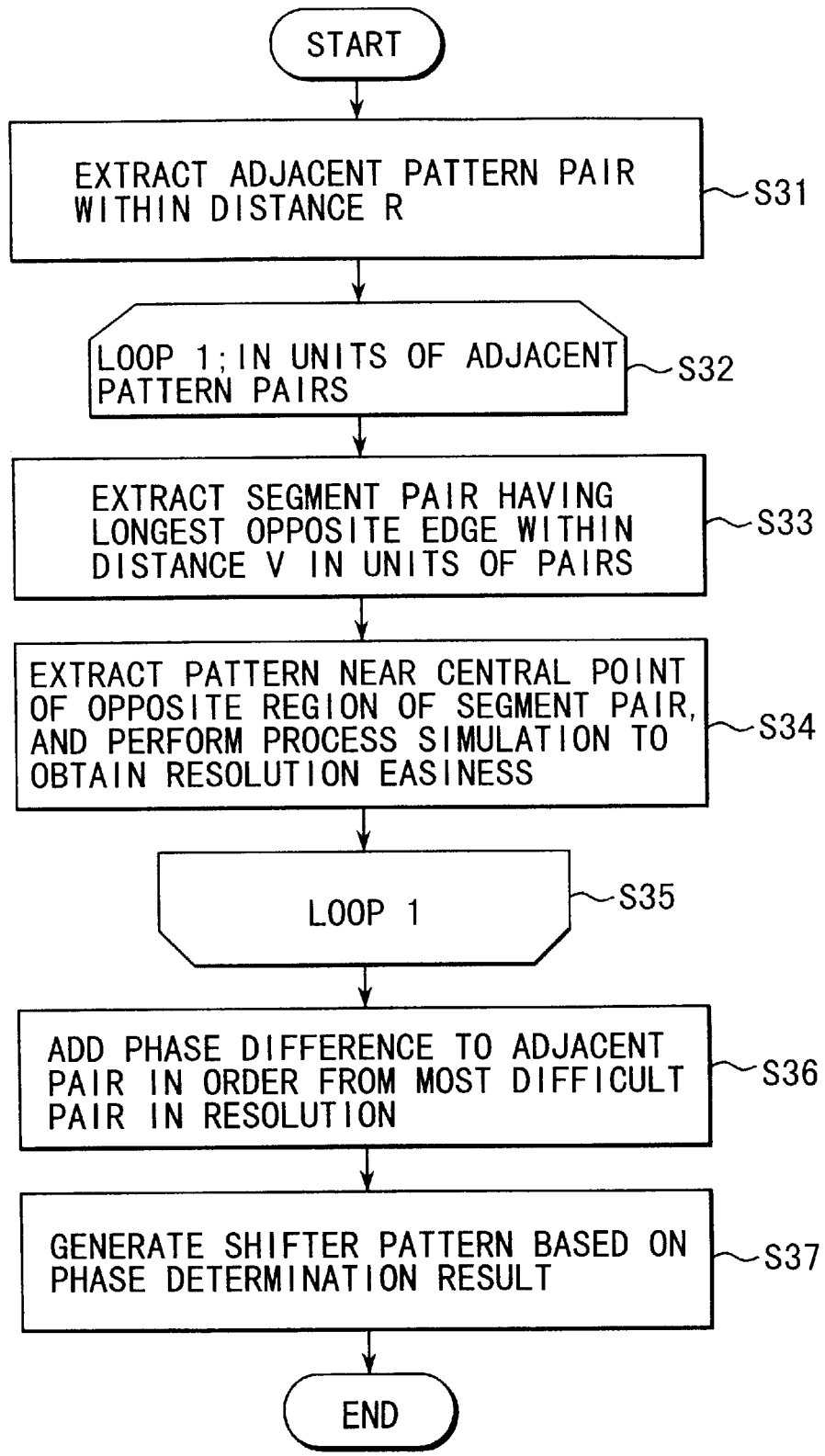
FIG. 20 is a flow chart showing the processing flow of a photomask design method according to the second embodiment of the present invention.

FIG. 20 shows the processing flow.

Of the patterns shown in FIG. 2, only an adjacent pattern pair F-G has two adjacent pattern edges, i.e., line segment pairs L32–L36 and L33–L39. Of these line segment pairs, the line segment pair L32–L36 is subjected to the resolution easiness calculation because it has the longest pattern edge within the distance V=0.2 μm. In an actual pattern, an adjacent pattern pair has a plurality of adjacent regions, as a matter of course. When this method is applied, the number of line segment pairs to be extracted for simulation is decreased, resulting in high-speed processing.

In step S31, all adjacent pattern pairs within a distance R are extracted. In steps S32 to S35, a line segment pair having the longest opposite region within the distance V is extracted for each adjacent pattern pair (step S33), and a pattern near the central point of the opposite region of the extracted line segment pair is extracted and subjected to process simulation to obtain the resolution easiness (step S34). Table 6 shows adjacent line segment pairs (adjacent pattern pairs) extracted from the patterns shown in FIG. 2 based on the second embodiment.

TABLE 6

| DATA STORING ORDER | ADJACENT PATTERN PAIR | RESOLUTION EASINESS (SEGMENT PAIR) |
|---|---|---|
| 1 | A-B | 0.109030(L3–L5) |
| 2 | A-C | 0.208263(L2–L15) |
| 3 | A-D | 0.109030(L3–L18) |
| 4 | B-C | 0.186710(L6–L15) |
| 5 | C-D | 0.186710(L15–L21) |
| 6 | C-F | 0.187768(L15–L31) |
| 7 | C-H | 0.198270(L14–L41) |
| 8 | C-I | 0.207607(L14–L45) |
| 9 | D-E | 0.228933(L23–L27) |
| 10 | D-F | 0.108360(L22–L30) |
| 11 | E-F | 0.109030(L28–L30) |
| 12 | F-G | 0.108632(L32–L36) |
| 13 | F-H | 0.229976(L33–L43) |
| 14 | F-I | 0.206975(L34–L44) |
| 15 | G-H | 0.108632(L38–L40) |
| 16 | H-I | 0.108360(L42–L44) |

Steps S36 and S37 for sorting and phase assignment are the same as those in the first embodiment, and the results are also the same as those in the first embodiment by chance, so tables will be omitted. Therefore, the shifter arrangement result is the same as that shown in FIG. 15.

The respective steps of the flow chart shown in FIG. 20 may be replaced with functional blocks for performing the corresponding steps, and these functional blocks may be connected to constitute a photomask design apparatus. Actually, this apparatus is implemented by a computer whose operation is controlled by a program loaded from a recording medium such as a magnetic disk.

Third Embodiment

The third embodiment is characterized in that a photomask design method of forming a plurality of opening patterns for passing incident light in a light-shielding film for shielding the incident light, and arranging, on some patterns, phase shifters for giving a phase difference to the incident light transmitted through the patterns comprises the steps of extracting an adjacent pattern pair within a predetermined range when the design layout includes patterns already having fixed phases, assigning priority to the extracted adjacent pattern pair, generating a node from the design layout, giving a node a phase value of fixed phase, in order of priority level of adjacent pattern pairs, (i) connecting nodes of the adjacent pattern pair in order not to form a closed loop of nodes when neither nodes of the adjacent pattern pair have phase information, and (ii) giving phase information opposite to that of one node to the other node and sequentially giving phase information to nodes connected to the nodes of which phases are assigned such that the phases of 0° and 180° are alternately assigned to the adjacent nodes when only one node of the adjacent pattern pair has phase information. Finally, an initial pattern is set for a group which is obtained by connecting nodes of adjacent pattern pairs and for which phase assignment is not done yet and phase is assigned by tracing the connected nodes from the initial pattern.

Figure 21:
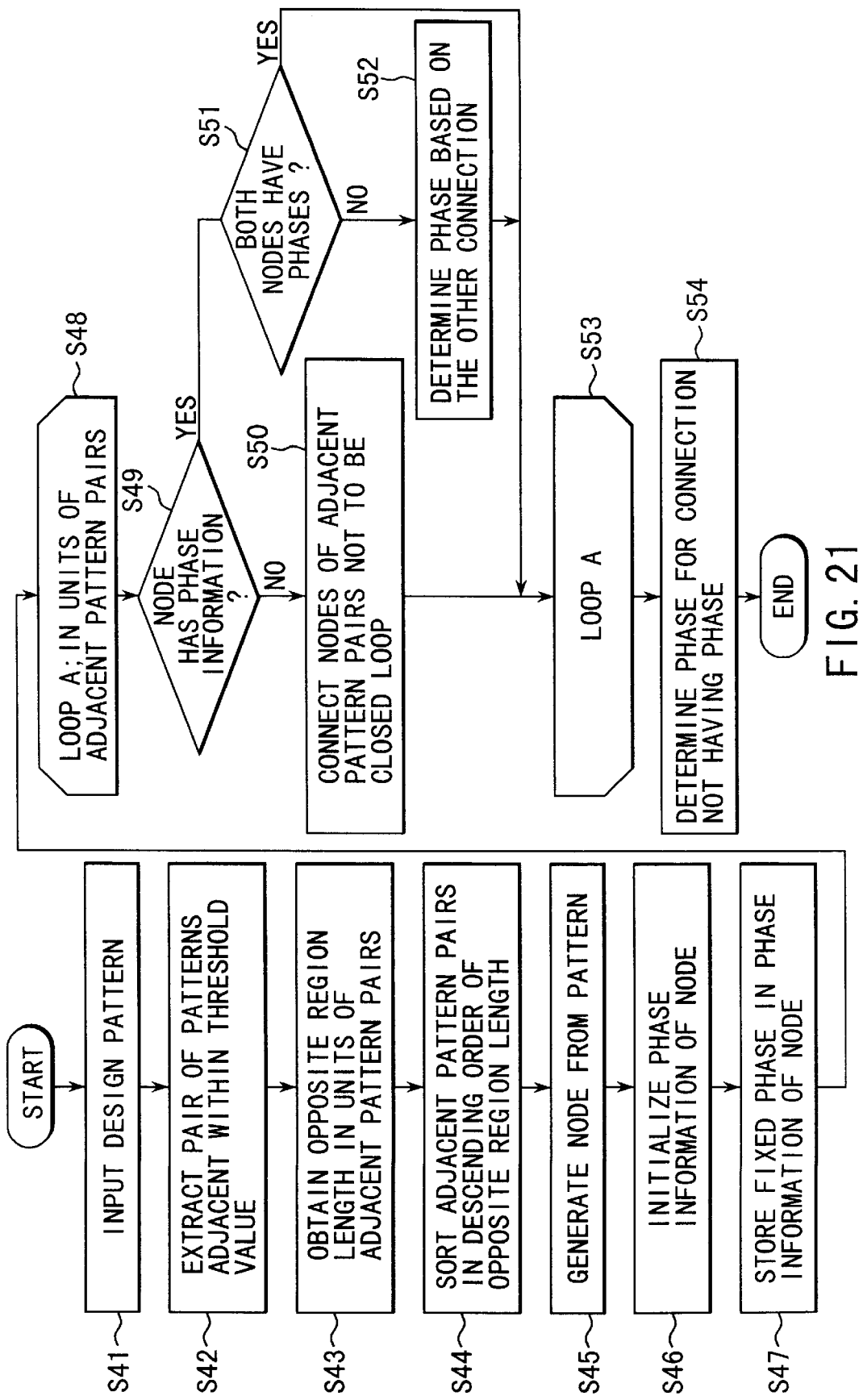
FIG. 21 is a flow chart showing the processing flow of a photomask design method according to the third embodiment of the present invention.
Figures 22, 23:
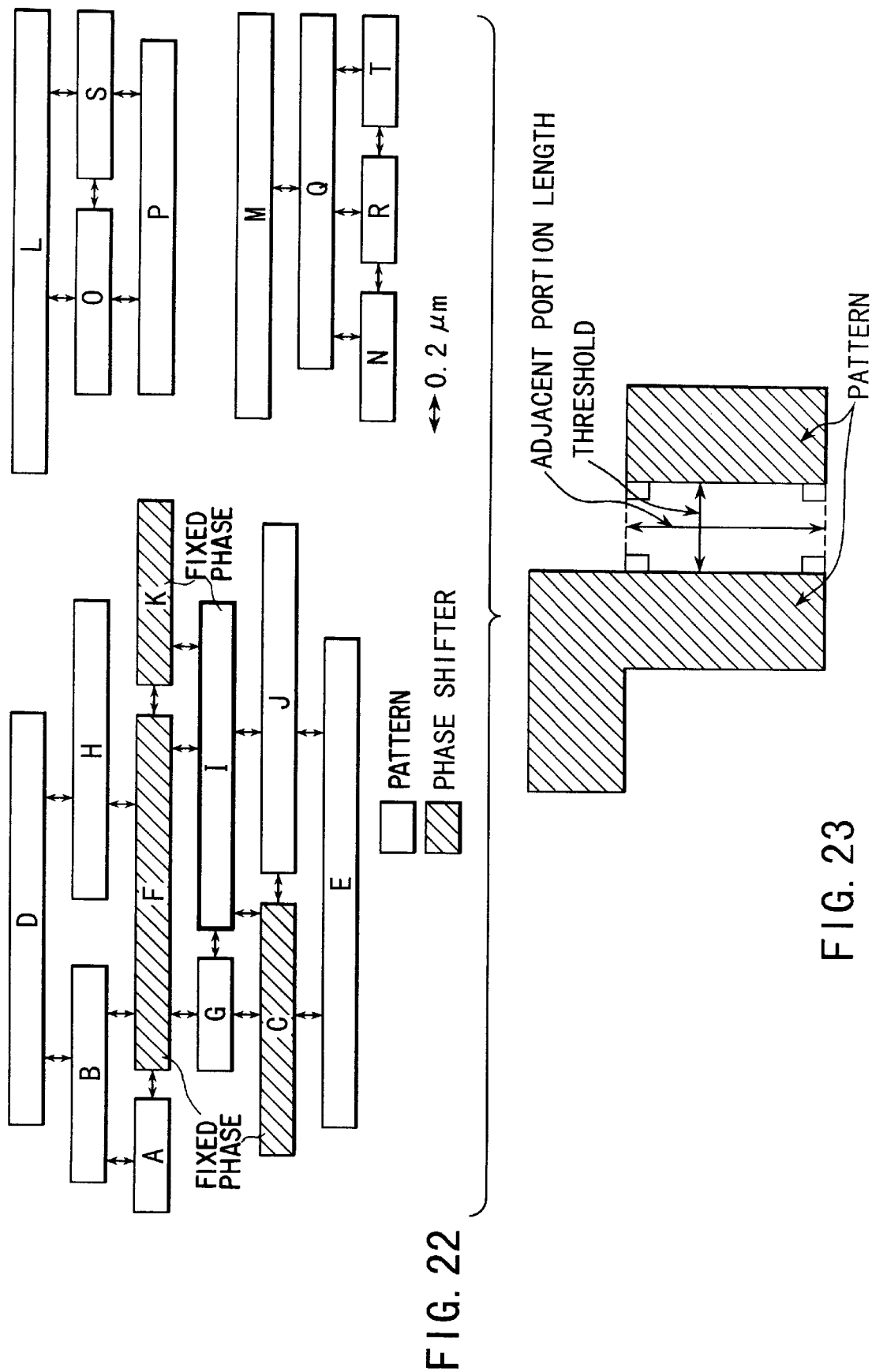
FIG. 22 is a view showing design layout data and fixed phase in the third embodiment.
FIG. 23 is a view for explaining the length of an adjacent portion.

FIG. 21 is a flow chart showing a photomask design method according to the third embodiment of the present invention. The operation of the third embodiment will be described while exemplifying a case wherein design data shown in FIG. 22 is input. Patterns A to T shown in FIG. 22 correspond to opening portions in a chromium film on a mask. The patterns C, F, I, and K already have fixed phases. The fixed phase may be assigned by a designer manually or assigned automatically by a software.

An adjacent pattern pair within a distance of 0.2 μm (threshold value) is extracted, and the length of the adjacent portion between the adjacent pairs is obtained, as shown in FIG. 23. Table 7 shows the result.

TABLE 7

| ADJACENT PATTERN PAIR | ADJACENT PORTION LENGTH (μm) |
|---|---|
| A-B | 0.6 |
| A-F | 0.2 |
| B-D | 1.2 |
| B-F | 0.8 |
| C-E | 1.6 |
| C-G | 0.8 |
| C-I | 0.2 |
| C-J | 0.2 |
| D-H | 1.4 |
| E-J | 1.8 |
| F-G | 0.8 |
| F-H | 1.4 |
| F-I | 1.6 |
| F-K | 0.2 |

TABLE 7-continued

| ADJACENT PATTERN PAIR | ADJACENT PORTION LENGTH (μm) |
|---|---|
| G-I | 0.2 |
| H-K | 0.6 |
| I-J | 2.0 |
| I-K | 0.6 |
| L-O | 1.4 |
| L-S | 1.2 |
| M-Q | 2.6 |
| N-Q | 0.6 |
| N-R | 0.2 |
| O-P | 1.4 |
| O-S | 0.2 |
| P-S | 1.0 |
| Q-R | 0.8 |
| Q-T | 0.8 |
| R-T | 0.2 |

The adjacent pattern pairs are sorted in order of adjacent portion length. Table 8 shows the result.

TABLE 8

| ADJACENT PATTERN PAIR | ADJACENT PORTION LENGTH (μm) |
|---|---|
| M-Q | 2.6 |
| I-J | 2.0 |
| E-J | 1.8 |
| C-E | 1.6 |
| F-I | 1.6 |
| D-H | 1.4 |
| F-H | 1.4 |
| L-O | 1.4 |
| O-P | 1.4 |
| B-D | 1.2 |
| L-S | 1.2 |
| P-S | 1.0 |
| B-F | 0.8 |
| C-G | 0.8 |
| F-G | 0.8 |
| Q-R | 0.8 |
| Q-T | 0.8 |
| A-B | 0.6 |
| H-K | 0.6 |
| I-K | 0.6 |
| N-Q | 0.6 |
| A-F | 0.2 |
| C-I | 0.2 |
| C-J | 0.2 |
| F-K | 0.2 |
| G-I | 0.2 |
| N-R | 0.2 |
| O-S | 0.2 |
| R-T | 0.2 |

Sorting is performed in order of adjacent portion length. This length is one of parameters indicating difficulty in modifying the patterns in a phase conflicting region. For example, the adjacent pattern pairs may be sorted in ascending order of resolution easiness (in order of difficulty in resolution), as in the first embodiment. Alternatively, another weighting condition may be used.

Figure 24A:
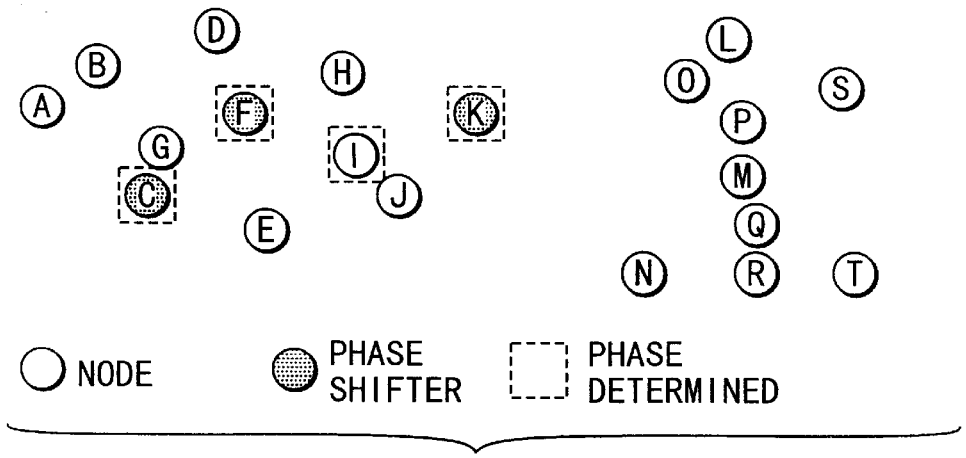
FIGS. 24A, 24B, 24C, 24D, 24E, 24F, 24G, 24H, 24I and 24J are views for explaining a phase assigning method according to the third embodiment.

As shown in FIG. 24A, the patterns are represented as nodes at step S45. At step S46, phase information of nodes are initialized. At step S47, fixed phases are assigned to the nodes C, F, I and K having certain phases in advance as phase information. In a loop from step S48 to S53, phase assignment for nodes having fixed phases and generation of a phase inversion graph for nodes for which phase assignment is not done yet are made in order of the sorted adjacent pattern pair based on the following three rules.

[1] When neither nodes have phase information, the nodes are connected not to form a closed loop (steps S49 and S50).

[2] When only one of the nodes has phase information, phase information opposite to the phase information is assigned to the other node to determine the phases of a series of nodes connected to the other node (step S49, S51 and S52).

[3] When both nodes have phase information, neither phase assignment nor node connection is performed (Yes in step S51).

Figure 24B:
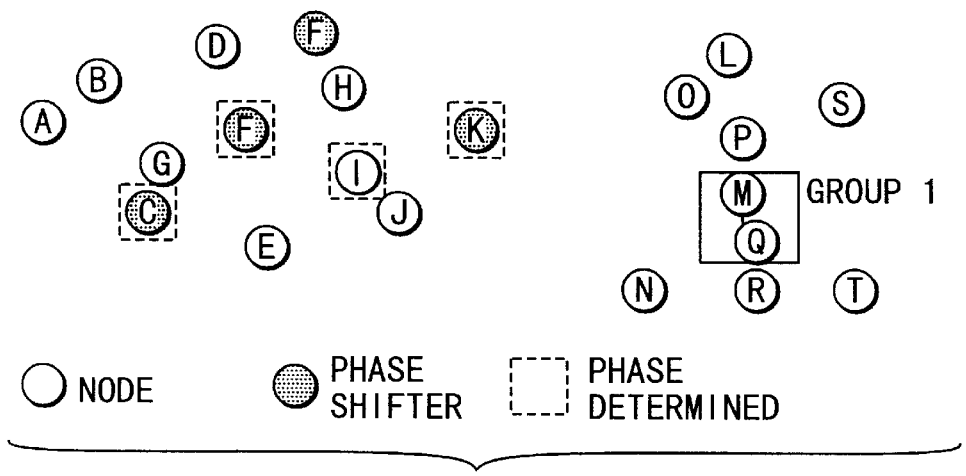

The nodes will be connected in units of adjacent pairs in descending order of adjacent portion length. The first pair of the sorted pairs, i.e., the adjacent pair M-Q will be considered. Since neither nodes have phase information, and no loop is formed by connecting these nodes, the nodes are connected and assigned group number 1, as shown in FIG. 24B. The group number is given to determine whether a loop is generated by connecting the nodes. Loop generation is determined in the following manner. If groups to which nodes of an adjacent pattern pair belong are identical, it is determined that a loop is formed. If the nodes belong to different groups, or one node is not assigned to a group, it is determined that no loop is formed.

Figure 24C:
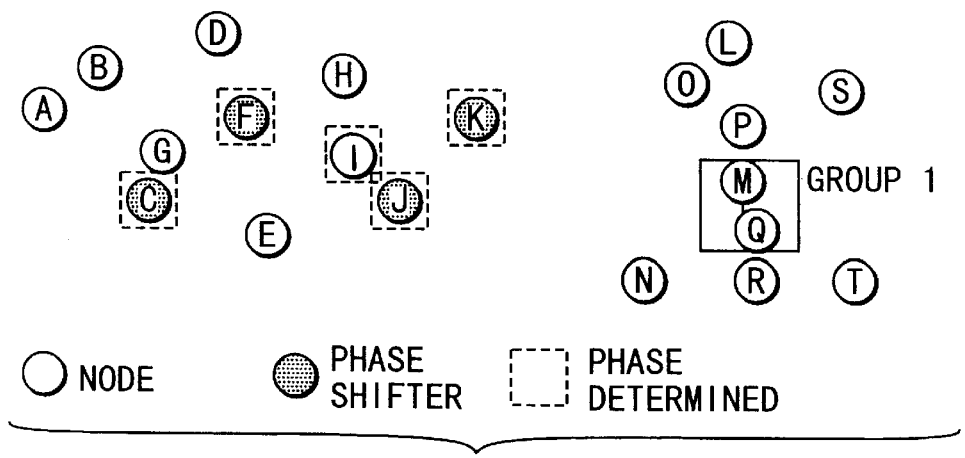

For the adjacent pair I-J, only the node I has phase information, so the phase is assigned for a group to which the other node J is connected. In this case, there is no group connected to the node J, so a phase opposite to that of the node I is assigned to the node J, as shown in FIG. 24C.

Figure 24D:
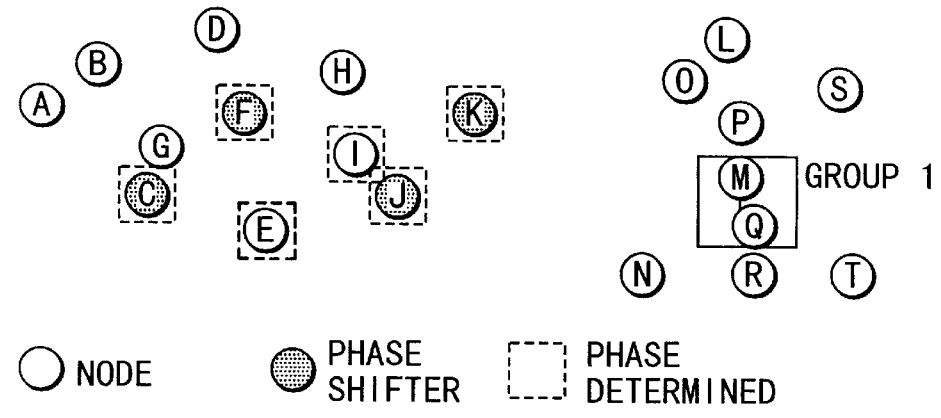

For the adjacent pair E-J, since only the node J has phase information, the phase is assigned for the node E and a group connected to the node E. In this case as well, there is no node to be connected to the node E, so a phase opposite to that of the node J is assigned only to the node E, as shown in FIG. 24D.

Figure 24E:
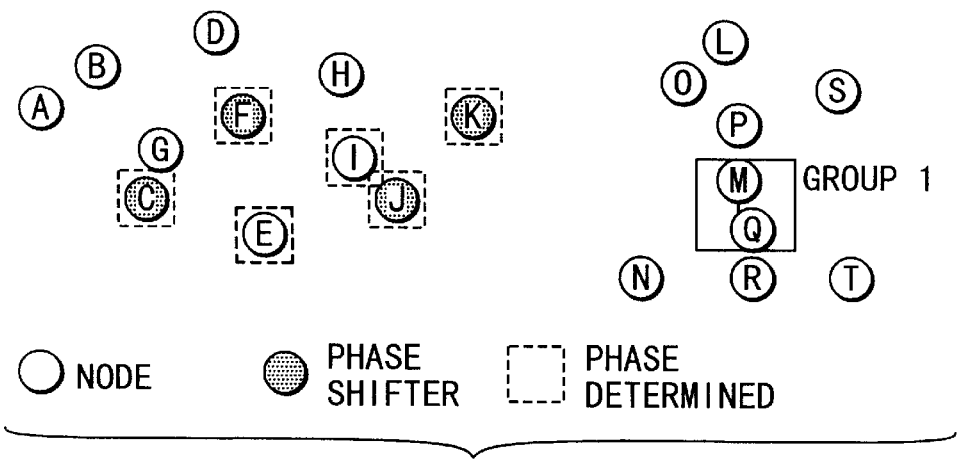
Figure 24F:
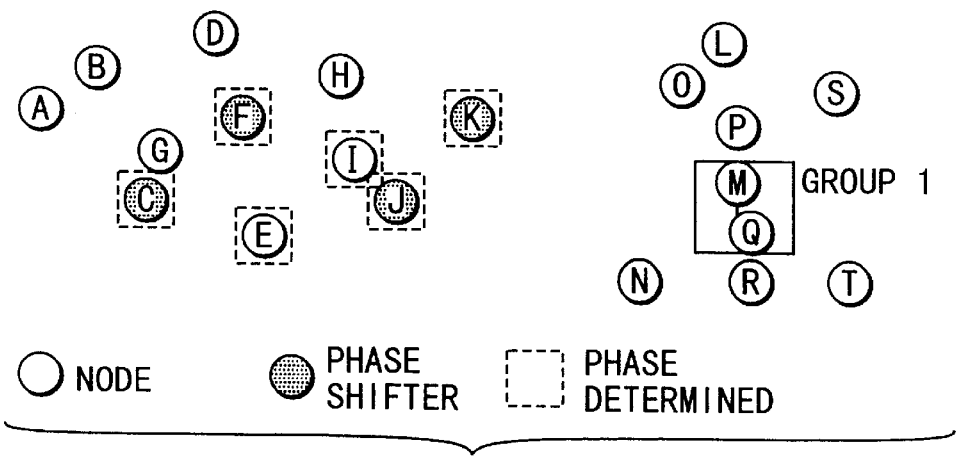

For the adjacent pair C-E, both nodes have phase information, so neither phase assignment nor connection of node patterns is performed, in accordance with rule [3], as shown in FIG. 24E. However, even if the nodes are connected, the same result is obtained. When rule [3] is applied, the processing speed is improved. For the adjacent pair F-I as well, both nodes have phase information, like the adjacent pair C-E. As shown in FIG. 24F, neither phase assignment nor connection of node patterns is performed in accordance with rule [3].

Figure 24G:
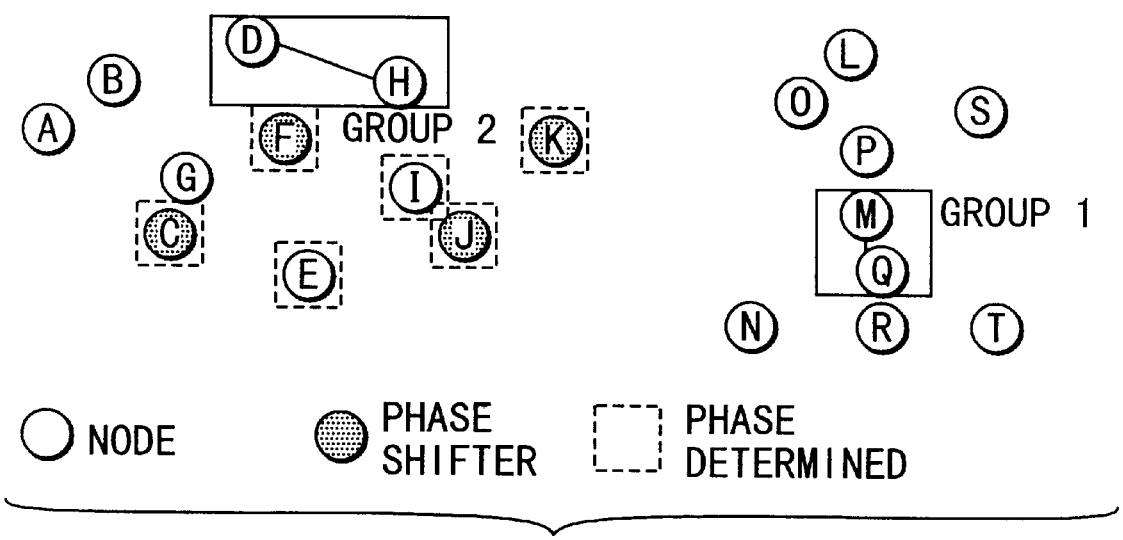

For the adjacent pair D-H, neither nodes have phase information, and no loop is formed by connecting the nodes. As shown in FIG. 24G, the nodes D and H are connected and assigned group number 2.

Figure 24H:
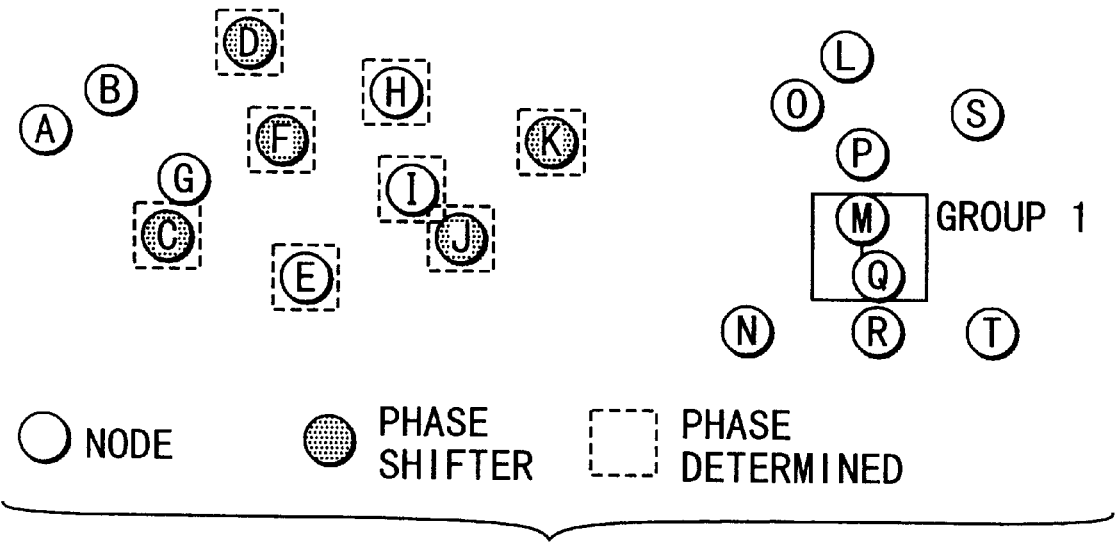

For the adjacent pair F-H, only the node F has phase information. Therefore, the phase is assigned for the node H and a group to which the node H is connected. In this case, since the node H is connected to group 2, a phase opposite to that of the node F is assigned to the node H as phase information, and a phase opposite to that of the node H is assigned to the node D connected to the node H, as shown in FIG. 24H. In this method, connection of groups for which phase assignment has been made is canceled. The connection need not be canceled because the result to be obtained does not change. However, canceling of connection allows deletion on the memory in computer processing.

Figure 24I:
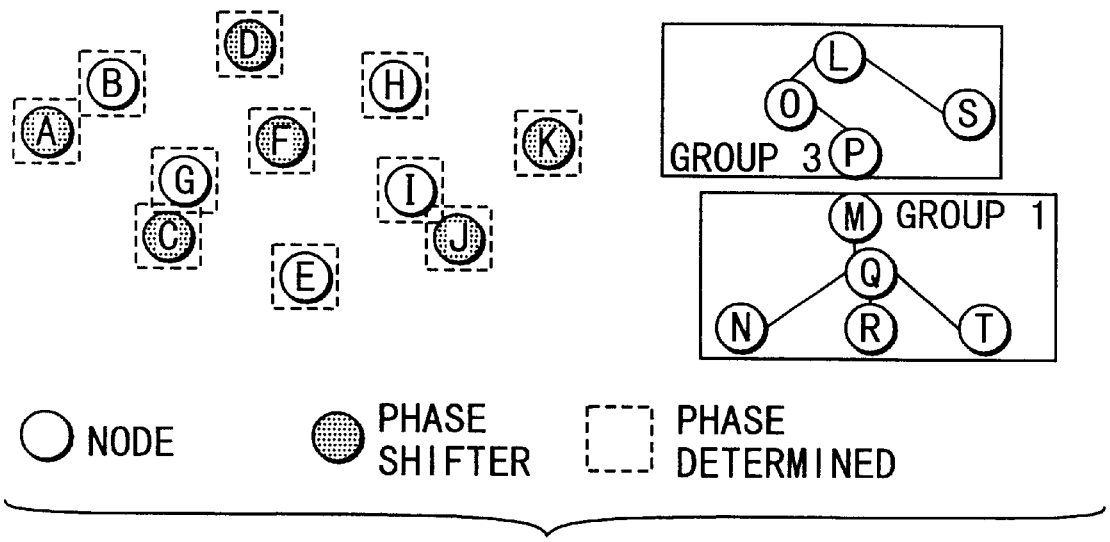
Figure 24J:
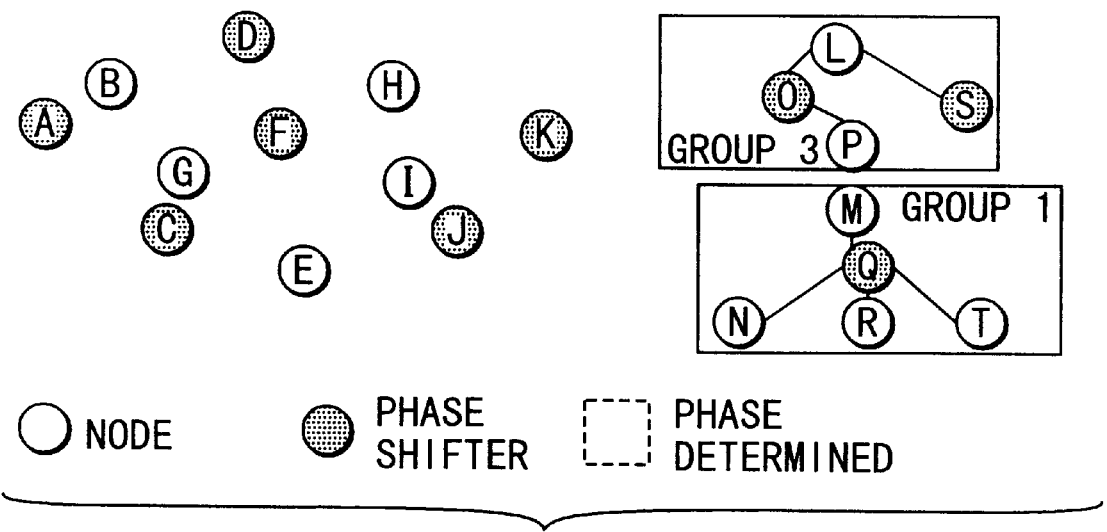
Figure 25:
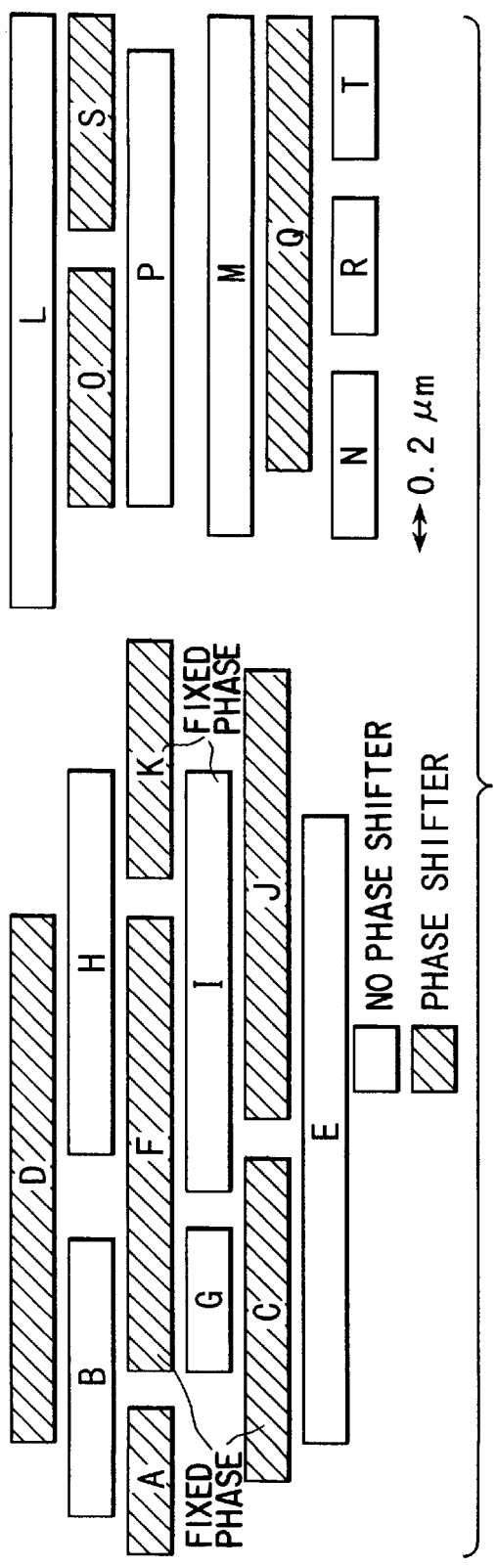
FIG. 25 is a view showing a phase assignment result based on the design layout of the third embodiment.

When all adjacent pattern pairs have been processed, a graph (phase inversion graph) and phase assigned nodes shown in FIG. 24I are finally obtained. The phases of groups 1 and 3 for which phase assignment is not done yet are assigned while setting nodes L and M as the initial nodes, respectively. FIG. 24J shows the result. FIG. 25 shows a corresponding design layout. According to the above method, phase assignment can be made in consideration of priority while holding fixed phases.

The respective steps of the flow chart shown in FIG. 21 may be replaced with functional blocks for performing the corresponding steps, and these functional blocks may be connected to constitute a photomask design apparatus. Actually, this apparatus is implemented by a computer whose operation is controlled by a program loaded from a recording medium such as a magnetic disk.

Fourth Embodiment

The fourth embodiment is characterized in that, in extracting the adjacent pattern pair in the third embodiment, extraction of an adjacent pattern pair whose adjacent patterns are already assigned fixed phases is omitted.

Figure 26:
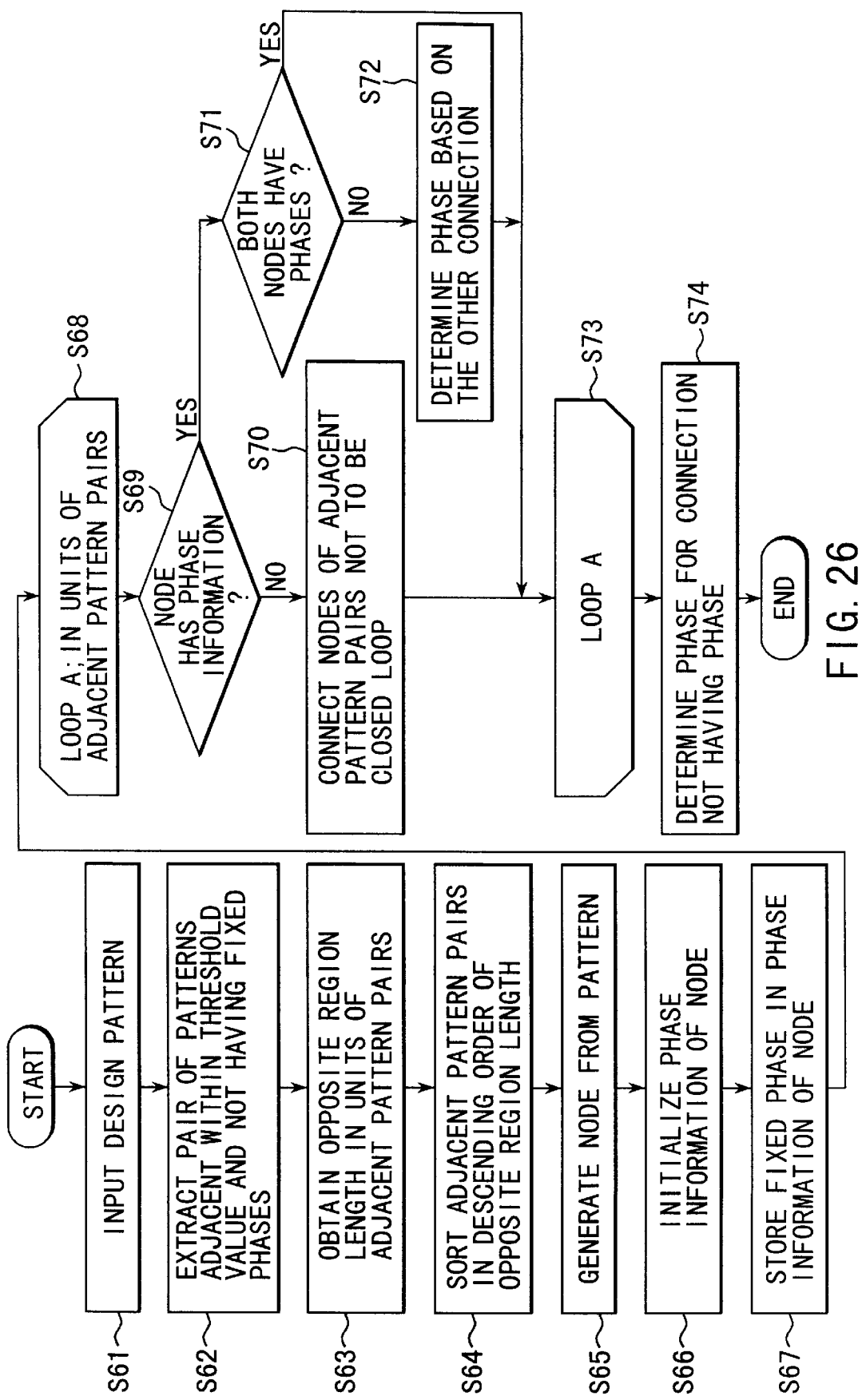
FIG. 26 is a flow chart showing the processing flow of a photomask design method according to the fourth embodiment of the present invention.

FIG. 26 is a flow chart showing a photomask design method according to the fourth embodiment of the present invention. A description will be made while exemplifying the layout data shown in FIG. 22, as in the third embodiment. Fixed phases are assigned to patterns C, F, I, and K, as in the third embodiment.

At step S61, a design layout is input. At step S62, adjacent pattern pairs within a distance of 0.2 μm are extracted. An adjacent pair having patterns both of which have fixed phases is not extracted. At step S63, the adjacent portion length of each extracted adjacent pair is obtained. Table 9 shows the result.

TABLE 9

| ADJACENT PATTERN PAIR | ADJACENT PORTION LENGTH(μm) |
|---|---|
| A-B | 0.6 |
| A-F | 0.2 |
| B-D | 1.2 |
| B-F | 0.8 |
| C-E | 1.6 |
| C-G | 0.8 |
| C-J | 0.2 |
| D-H | 1.4 |
| E-J | 1.8 |
| F-G | 0.8 |
| F-H | 1.4 |
| G-I | 0.2 |
| H-K | 0.6 |
| I-J | 2.0 |
| L-O | 1.4 |
| L-S | 1.2 |
| M-Q | 2.6 |
| N-Q | 0.6 |
| N-R | 0.2 |
| O-P | 1.4 |
| O-S | 0.2 |
| P-S | 1.0 |
| Q-R | 0.8 |
| Q-T | 0.8 |
| R-T | 0.2 |

In the third embodiment, 29 adjacent pattern pairs are obtained. In the fourth embodiment, 25 adjacent pattern pairs are obtained because four adjacent pattern pairs each including patterns both of which have fixed phases are omitted. The adjacent pattern pairs are sorted in order of adjacent portion length. Table 10 shows the result.

TABLE 10

| ADJACENT PATTERN PAIR | ADJACENT PORTION LENGTH(μm) |
|---|---|
| M-Q | 2.6 |
| I-J | 2.0 |
| E-J | 1.8 |
| C-E | 1.6 |
| D-H | 1.4 |

TABLE 10-continued

| ADJACENT PATTERN PAIR | ADJACENT PORTION LENGTH(μm) |
|---|---|
| F-H | 1.4 |
| L-O | 1.4 |
| O-P | 1.4 |
| B-D | 1.2 |
| L-S | 1.2 |
| P-S | 1.0 |
| B-F | 0.8 |
| C-G | 0.8 |
| F-G | 0.8 |
| Q-R | 0.8 |
| Q-T | 0.8 |
| A-B | 0.6 |
| H-K | 0.6 |
| N-Q | 0.6 |
| A-F | 0.2 |
| C-J | 0.2 |
| G-I | 0.2 |
| N-R | 0.2 |
| O-S | 0.2 |
| R-T | 0.2 |

In the same manner as the third embodiment, as shown in FIG. 24A, the patterns are represented as nodes at step S65. At step S66, phase information of nodes are initialized. At step S67, fixed phases are assigned to the nodes C, F, I and K having certain phases in advance as phase information. In a loop from step S68 to S73, phase assignment for nodes having fixed phases and generation of a phase inversion graph for nodes for which phase assignment is not done yet are made in accordance with the order of the sorted adjacent pattern pair based on the above three rules of the third embodiment. The phase inversion graph, the phase assignment result, and the shifter arrangement result are the same as those shown in FIGS. 24I and 24J and FIG. 25 in the third embodiment.

In the method of this embodiment, the number of adjacent pattern pairs to be extracted is decreased. Accordingly, the number of data to be subjected to the operation of obtaining the adjacent portion length and phase inversion graph generation is decreased, resulting in high-speed processing.

Fifth Embodiment

The fifth embodiment is characterized in that, in priority assignment in the third embodiment, higher priority is assigned to an adjacent pattern pair in which only one of adjacent patterns has a fixed phase than that of an adjacent pattern pair not having a fixed phase.

Figure 27:
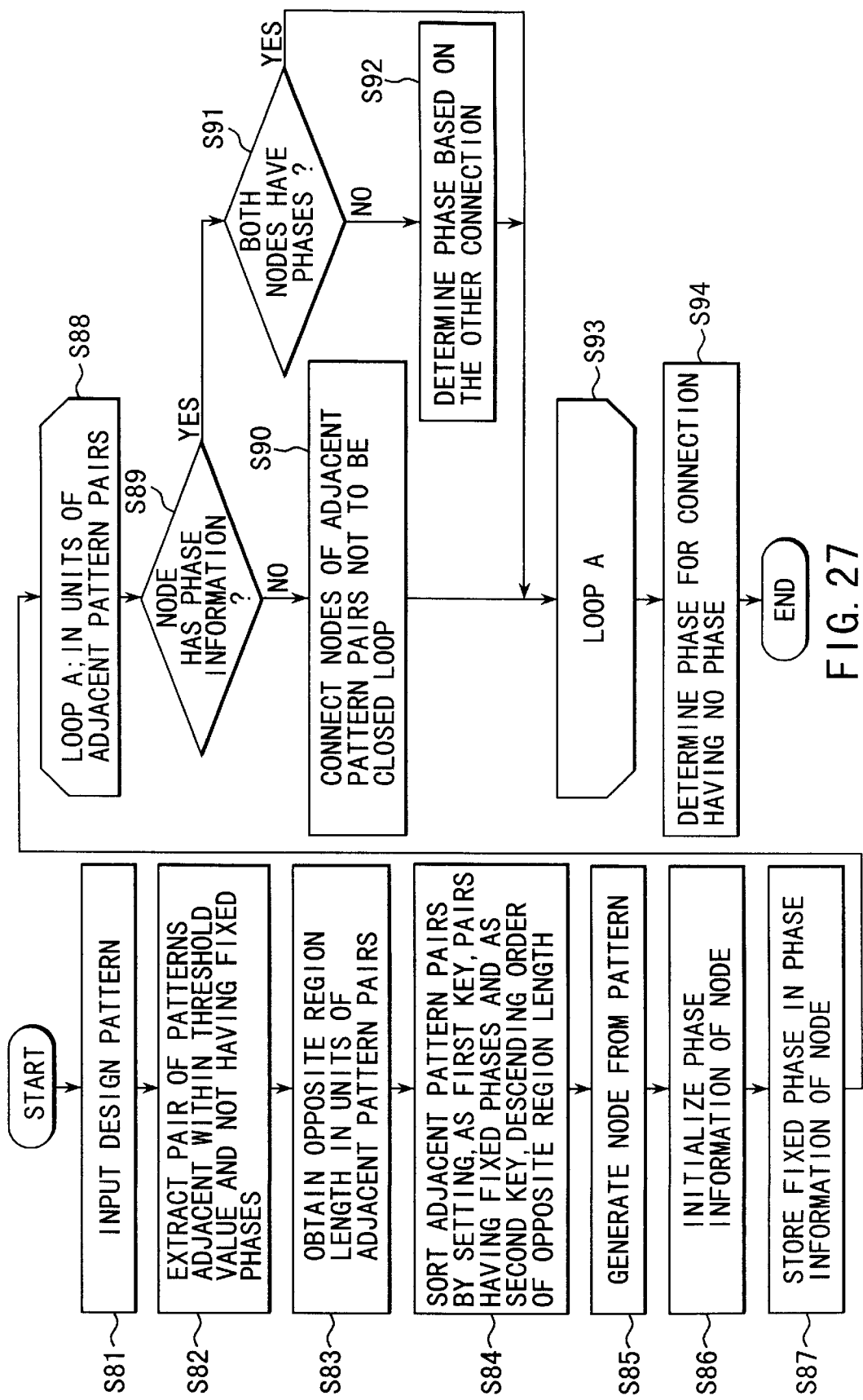
FIG. 27 is a flow chart showing the processing flow of a photomask design method according to the fifth embodiment of the present invention.

FIG. 27 is a flow chart showing a photomask design method according to the fifth embodiment of the present invention. A description will be made while exemplifying the layout shown in FIG. 22, as in the third and fourth embodiments. In this case as well, fixed phases are assigned to patterns C, F, I, and K.

In step S81, a design layout is input. At step S82, adjacent pattern pairs within a distance of 0.2 μm are extracted. All pattern pairs may be extracted, as in the third embodiment. In the fifth embodiment, however, an adjacent pattern pair including patterns both of which have fixed phases is not extracted, as in the fourth embodiment. The adjacent portion length of each extracted adjacent pair is obtained. An adjacent pattern pair in which only one of adjacent pattern has a fixed phase is assigned a fixed phase flag. Table 11 shows the result.

TABLE 11

| ADJACENT PATTERN PAIR | ADJACENT PORITON LENGTH(μm) | FIXED PHASE FLAG |
|---|---|---|
| A-B | 0.6 | |
| A-F | 0.2 | set |
| B-D | 1.2 | |
| B-F | 0.8 | set |
| C-E | 1.6 | set |
| C-G | 0.8 | set |
| C-J | 0.2 | set |
| D-H | 1.4 | |
| E-J | 1.8 | |
| F-G | 0.8 | set |
| F-H | 1.4 | set |
| G-I | 0.2 | set |
| H-K | 0.6 | set |
| I-J | 2.0 | set |
| L-O | 1.4 | |
| L-S | 1.2 | |
| M-Q | 2.6 | |
| N-Q | 0.6 | |
| N-R | 0.2 | |
| O-P | 1.4 | |
| O-S | 0.2 | |
| P-S | 1.0 | |
| Q-R | 0.8 | |
| Q-T | 0.8 | |
| R-T | 0.2 | |

At step S84, the adjacent pattern pairs are sorted by setting, as the first key, one of patterns which has a fixed phase and as the second key, in order of adjacent portion length. Table 12 shows the result.

TABLE 12

| ADJACENT PATTERN PAIR | ADJACENT PORTION LENGTH(μm) | FIXED PHASE FLAG |
|---|---|---|
| I-J | 2.0 | set |
| C-E | 1.6 | set |
| F-H | 1.4 | set |
| B-F | 0.8 | set |
| C-G | 0.8 | set |
| F-G | 0.8 | set |
| H-K | 0.6 | set |
| A-F | 0.2 | set |
| C-J | 0.2 | set |
| G-I | 0.2 | set |
| M-Q | 2.6 | |
| E-J | 1.8 | |
| D-H | 1.4 | |
| L-O | 1.4 | |
| O-P | 1.4 | |
| B-D | 1.2 | |
| L-S | 1.2 | |
| P-S | 1.0 | |
| Q-R | 0.8 | |
| Q-T | 0.8 | |
| A-B | 0.6 | |
| N-Q | 0.6 | |
| N-R | 0.2 | |
| O-S | 0.2 | |
| R-T | 0.2 | |

Figure 29:
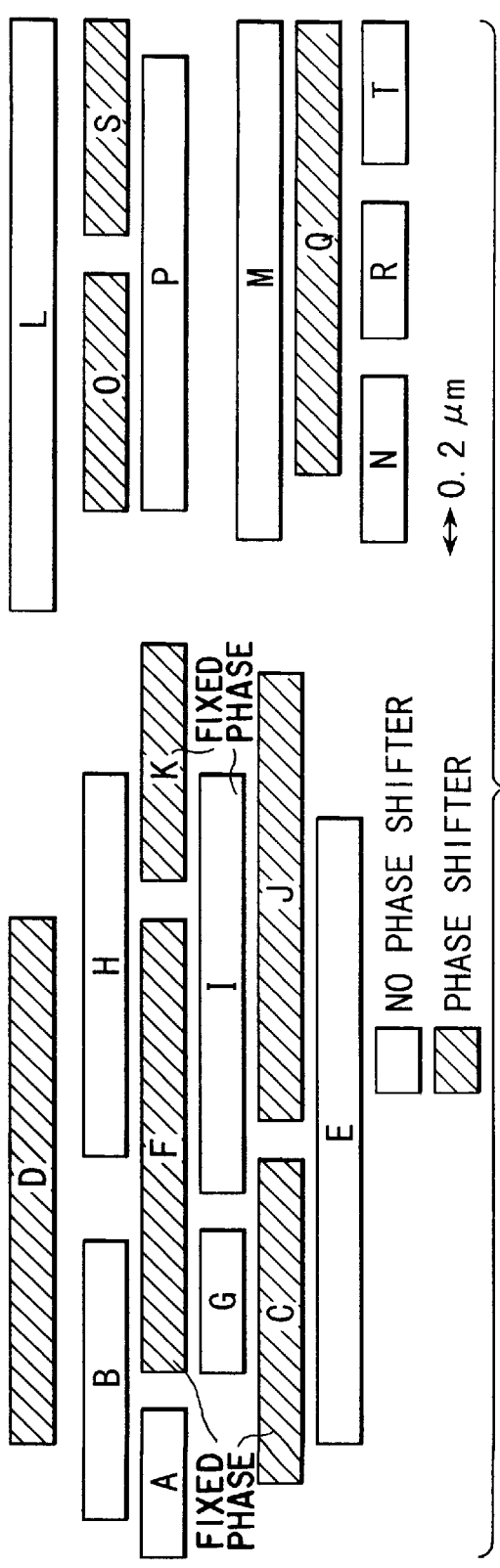
FIG. 29 is a view showing a phase assignment result based on the design layout of the fifth embodiment.
Figure 28A:
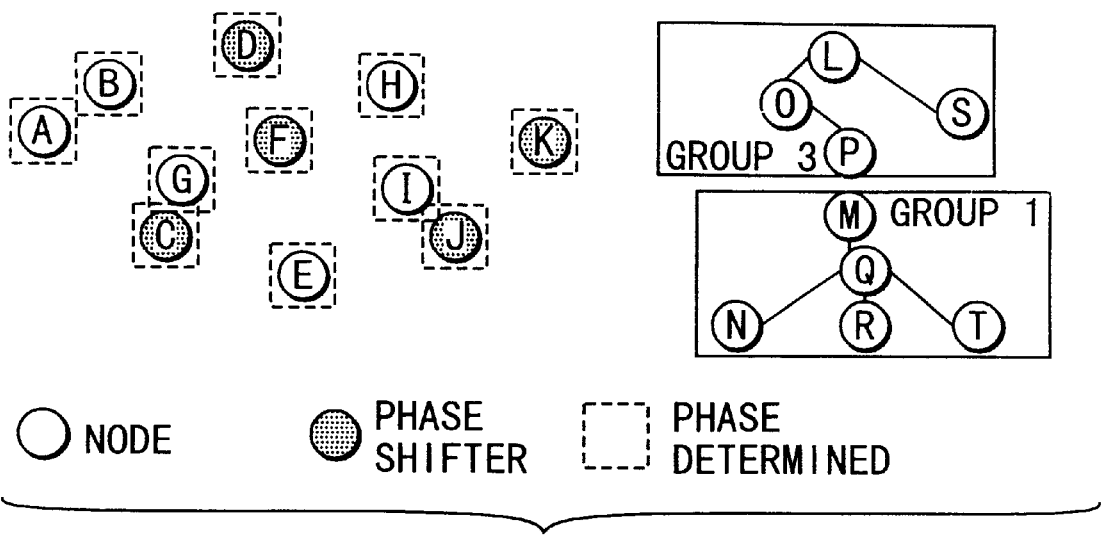
FIGS. 28A and 28B are views for explaining a phase assigning method according to the fifth embodiment.
Figure 28B:
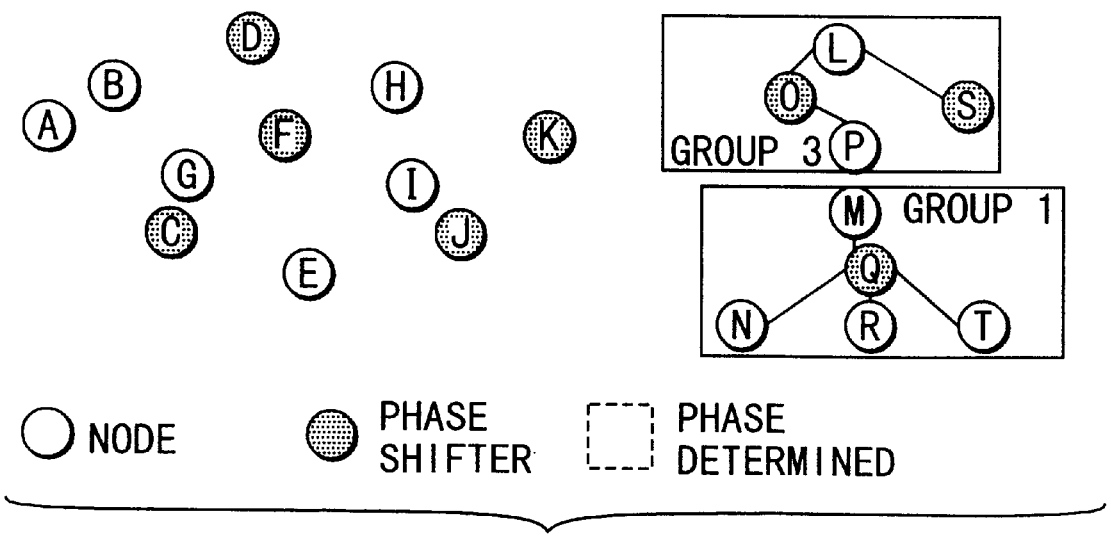

In the same manner as the third embodiment, as shown in FIG. 24A, the patterns are represented as nodes at step S85. At step S86, phase information of nodes are initialized. At step S87, fixed phases are assigned to the nodes C, F, I and K having certain phase values in advance. In a loop from step S88 to S93, phase assignment and generation of a phase inversion graph are made in accordance with the order of the sorted adjacent pattern pair based on the above three rules of the third embodiment. At step S94, phase assignment is done for a group of which phase assignment is not done yet. The phase inversion graph as shown in FIG. 28A is obtained. FIG. 28B shows phases assigned based on the phase inversion graph. FIG. 29 shows the shifter arrangement result for the corresponding design layout.

The shifter arrangement result of this embodiment is not so different from that of the third or fourth embodiment (the difference becomes larger in phase assignment for actual patterns having fixed phases) except the phase of the pattern A. This is because any pattern adjacent to a fixed phase is preferentially assigned a phase difference. According to the fifth embodiment, priority for phase assignment of a pattern pair adjacent to a fixed phase can be made high, so the higher resolution can be obtained at the end portion of the fixed phase pattern.

In the above-described third to fifth embodiments, the threshold value used to obtain an adjacent pair is 0.2 μm. However, the threshold value is not limited to this. Normally, a value which reflects the characteristic feature of the pattern of an objective device is set. In these embodiments, the nodes are connected not to form a closed loop. This is because if a closed loop of an odd number of nodes is generated, phase conflict is generated. When a closed loop of an even number of nodes is generated, an arbitrary one can be selected for phase assignment, so generation of a closed loop of an even number of nodes is permitted. That is, the nodes may be connected not to generate a closed loop of an odd number of nodes.

The various methods according to the above embodiments can be embodied as design devices executing computer programs of the above methods which are stored in a magnetic disk (floppy disk or hard disk), an optical disk (CD-ROM or DVD) or a semiconductor memory device or computer programs downloaded via a communication network into the devices.

As has been described above, the present invention provides the following photomask design methods.

(1) A photomask design method of forming a plurality of opening patterns for passing incident light in a light-shielding film, and arranging, on some patterns, phase shifters for giving a phase difference to the incident light transmitted through the patterns, comprising the following steps of:

decomposing patterns into line segments;

extracting line segment pairs which are adjacent within a predetermined distance R and belong to different patterns;

obtaining, in units of line segments, a pattern formed of lines and spaces within a predetermined distance S from the central position of an opposite region where the line segments oppose each other in a direction perpendicular to the line segments;

obtaining resolution easiness representing the easiness in resolving the line segments of adjacent patterns using a process simulation, an experiment, or a combination thereof for the obtained pattern; and determining a phase shifter arrangement to give a phase difference to the line segments of adjacent patterns in order of resolution difficulty (in ascending order of resolution easiness).

(2) A photomask design method of forming a plurality of opening patterns for passing incident light in a light-shielding film, and arranging, on some patterns, phase shifters for giving a phase difference to the incident light transmitted through the patterns, comprising the following steps of:

extracting an adjacent pattern pair within a predetermined distance R;

decomposing each pattern into line segments;

obtaining a pattern formed of lines and spaces within a distance S from the central position of an opposite region in a direction perpendicular to the line segments, the opposite region being expected to be most hard to resolve;

obtaining resolution easiness representing the easiness in resolving the adjacent patterns using a process simulation, an experiment, or a combination thereof for the obtained pattern; and arranging phase shifters based on the obtained resolution easiness of the patterns adjacent within the distance R to give a phase difference in order of resolution difficulty (in ascending order of resolution easiness).

(3) In the design method (1) or (2), a line segment is further divided as follows:

(3a) A line segment of interest is divided at or near the intersection point of a perpendicular dropped from the vertex of an adjacent pattern opposing the pattern including the line segment of interest to the line segment of interest, the adjacent pattern being within a predetermined distance from the line segment of interest in a direction perpendicular to the line segment, so as not to make the length of each line segment after division smaller than a predetermined length.

(3b) A line segment of interest is divided at or near the intersection point of a perpendicular dropped from the vertex of a pattern to the line segment of interest, the pattern being within a predetermined distance from the line segment of interest in a direction perpendicular to the line segment, so as not to make the length of each line segment after division smaller than a predetermined length.

(4) In the design method (1) or (2), the pattern within the distance S from the central position of the opposite region is obtained in units of line segments in accordance with one of the following rules:

(4a) Only a pattern pair to which the line segments of interest belong is extracted.

(4b) Patterns within a distance of S in a direction perpendicular to the length direction of the opposite region from the central position of the opposite region are one-dimensionally extracted.

(4c) Patterns within a square having a size of 2S×2S and centered on the central position of the opposite region are two-dimensionally extracted.

(4d) If an adjacent line segment within a predetermined distance from the line segment pair of interest in a direction perpendicular to the line segment pair is placed in a direction neither perpendicular nor parallel to the line segment pair of interest, patterns including the line segments of interest are two-dimensionally extracted.

(4e) If there is a line segment near the opposite region placed in a direction neither perpendicular nor parallel to the mask data design coordinate axes, patterns including the line segment pair of interest are two-dimensionally extracted.

(4f) If the opposite region length is smaller than T, patterns are two-dimensionally extracted and if not, patterns are one-dimensionally extracted.

(5) In the design method (1) or (2), the resolution easiness is obtained by any one of the following methods:

(5a) The light intensity value at the central position of the opposite region of the line segment pair of interest is subtracted from the smaller one of light intensity values at the central positions of the respective pattern portions in the adjacent pattern pair of interest. As the value of the difference becomes larger, it becomes easier to resolve the line segment pair.

(5b) The light intensity value at the central position of the opposite region of the line segment pair of interest is subtracted from the average value of light intensity values at the central positions of the respective pattern portions in the adjacent pattern pair of interest. As the value of the difference becomes larger, it becomes easier to resolve the line segment pair.

(5c) A light intensity for resolving a resist is set as a slice level, the light intensity value at the central position of the opposite region of the line segment pair of interest is subtracted from the slice level value. As the value of the difference becomes larger, it becomes easier to resolve the line segment pair.

(5d) The tilt angle of a tangent at the position between a central position of each pattern portions and a central point of a central point of an opposite region in a light intensity distribution is obtained. As the value of the tile angle becomes larger, it becomes easier to resolve the line segment pair.

(5e) The dependence between the combination of focus and dose and the pattern dimension difference from a desired dimension is obtained using a process simulation, an experiment, or a combination thereof. The size of a window constituted by dose and defocus margin is checked in consideration of the dose, the defocus margin, or both margins. As the margin or window becomes larger, it becomes easier to resolve the line segment pair.

(5f) The window representing the process margin is obtained using a process simulation, an experiment, or a combination thereof. As the window becomes larger, it becomes easier to resolve the line segment pair.

(5g) The size of a window common to process margins at a plurality of positions of interest in an adjacent pattern pair is obtained using a process simulation, an experiment, or a combination thereof. As the window becomes larger, it becomes easier to resolve the line segment pair.

(5h) The light intensity at the central position of the opposite region of the line segment pair of interest is obtained. As the intensity becomes smaller, it becomes easier to resolve the line segment pair.

(5i) Two or more of methods (5a) to (5h) are combined and used.

(6) In the design method (1) or (2), pattern arrangement information used for the process simulation and the resolution easiness obtained using the process simulation, the experiment, or the combination thereof are stored in a table. Every time a pattern is extracted, the table is looked up. If pattern arrangement information matching the extracted pattern is stored in the table, corresponding resolution easiness is obtained from the table; otherwise, resolution easiness is obtained using the process simulation, the experiment, or the combination thereof.

(7) In the design method (1) or (2), the process simulation is an exposure simulation, a development simulation, an etching simulation, or a combination of a plurality of simulations.

(8) In the design method (2), a line segment pair in the pattern pair of interest, which has the longest opposite region within a distance V, is defined as a portion most difficult to resolve in the pattern pair of interest, and the portion is subjected to pattern pair resolution easiness evaluation.

(9) A photomask design method of forming a plurality of opening patterns for passing incident light in a light-shielding film, and arranging, on some patterns, phase shifters for giving a phase difference to the incident light transmitted through the patterns, for the design layout including patterns already having fixed phases, the method comprising the following steps of:

extracting an adjacent pattern pair within a predetermined range;

assigning priority to the extracted adjacent pattern pair;

generating a node from the design layout;

giving, to a node of a pattern having a fixed phase a phase value corresponding to the phase information of the pattern;

in order of priority levels of adjacent pattern pairs, (i) connecting nodes of the adjacent pattern pair so as not to form a closed loop of an odd number of nodes when neither nodes of the adjacent pattern pair have phase information, and (ii) giving phase information opposite to that of one node to the other node and sequentially giving phase information to nodes connected to the nodes of which phases are assigned such that the phases of 0° and 180° are alternately assigned to the adjacent nodes when only one node of the adjacent pattern pair has phase information; and setting an initial pattern for a group which is obtained by connecting nodes of adjacent pattern pairs and for which phase assignment is not done yet and determining phase by tracing the connected nodes from the initial pattern.

(10) In the design method (9), in extracting the adjacent pattern pair, extraction of an adjacent pattern pair whose adjacent patterns already have fixed phases is omitted.

(11) In the design method (9), in assigning priority, higher priority is assigning to an adjacent pattern pair in which only one of adjacent patterns has fixed phase than that of an adjacent pattern pair not having a fixed phase.

The present invention also provides the following photomask design apparatuses.

(1) A photomask design apparatus for forming a plurality of opening patterns for passing incident light in a light-shielding film, and arranging, on some patterns, phase shifters for giving a phase difference to the incident light transmitted through the patterns, comprising:

means for decomposing patterns into line segments;

means for extracting line segment pairs which are adjacent within a predetermined distance R and belong to different patterns;

means for obtaining, in units of line segments, a pattern formed of lines and spaces within a predetermined distance S from the central position of an opposite region where the line segments oppose each other in a direction perpendicular to the line segments;

means for obtaining resolution easiness representing the easiness in resolving the line segments of adjacent patterns using a process simulation, an experiment, or a combination thereof for the obtained pattern; and means for determining a phase shifter arrangement to give a phase difference to the line segments of adjacent patterns in order of resolution difficulty (in ascending order of resolution easiness).

(2) A photomask design apparatus for forming a plurality of opening patterns for passing incident light in a light-shielding film, and arranging, on some patterns, phase shifters for giving a phase difference to the incident light transmitted through the patterns, comprising:

means for extracting an adjacent pattern pair within a predetermined distance R;

means for decomposing each pattern into line segments;

means for obtaining a pattern formed of lines and spaces within a distance S from the central position of an opposite region in a direction perpendicular to the line segments, the opposite region being expected to be most hard to resolve;

means for obtaining resolution easiness representing the easiness in resolving the adjacent patterns using a process simulation, an experiment, or a combination thereof for the obtained pattern; and means for arranging phase shifters based on the obtained resolution easiness of the patterns adjacent within the distance R to give a phase difference in order of resolution difficulty (in ascending order of resolution easiness).

(3) A photomask design apparatus for forming a plurality of opening patterns for passing incident light in a light-shielding film, and arranging, on some patterns, phase shifters for giving a phase difference to the incident light transmitted through the patterns, for the design layout including patterns already having fixed phases, comprising:

means for extracting an adjacent pattern pair within a predetermined range;

means for assigning priority to the extracted adjacent pattern pair;

means for generating a node from the design layout;

means for giving, to a node of a pattern having a fixed phase a phase value corresponding to the phase information of the pattern;

means for, in order of priority levels of adjacent pattern pairs, (i) connecting nodes of the adjacent pattern pair so as not to form a closed loop of an odd number of nodes when neither nodes of the adjacent pattern pair have phase information, and (ii) giving phase information opposite to that of one node to the other node and sequentially giving phase information to nodes connected to the nodes of which phases are assigned such that the phases of 0° and 180° are alternately assigned to the adjacent nodes when only one node of the adjacent pattern pair has phase information; and means for setting an initial pattern for a group which is obtained by connecting nodes of adjacent pattern pairs and for which phase assignment is not done yet and determining phase by tracing the connected nodes from the initial pattern.

The present invention also provides the following computer readable recording media storing a program for designing a photomask.

(1) A computer readable recording media storing a program for designing a photomask in which a plurality of opening patterns for passing incident light are formed in a light-shielding film, and some patterns have phase shifters for giving a phase difference to the incident light transmitted through the patterns, the program comprising the following steps of:

decomposing patterns into line segments;

extracting line segment pairs which are adjacent within a predetermined distance R and belong to different patterns;

obtaining, in units of line segments, a pattern formed of lines and spaces within a predetermined distance S from the central position of an opposite region where the line segments oppose each other in a direction perpendicular to the line segments;

obtaining resolution easiness representing the easiness in resolving the line segments of adjacent patterns using a process simulation, an experiment, or a combination thereof for the obtained pattern; and determining a phase shifter arrangement to give a phase difference to the line segments of adjacent patterns in order of resolution difficulty (in ascending order of resolution easiness).

(2) A computer readable recording medium storing a program for designing a photomask in which a plurality of opening patterns for passing incident light are formed in a light-shielding film, and some patterns have phase shifters for giving a phase difference to the incident light transmitted through the patterns, the program comprising the following steps of:

extracting an adjacent pattern pair within a predetermined distance R;

decomposing each pattern into line segments;

obtaining a pattern formed of lines and spaces within a distance S from the central position of an opposite region in a direction perpendicular to the line segments, the opposite region being expected to be most hard to resolve;

obtaining resolution easiness representing the easiness in resolving the adjacent patterns using a process simulation, an experiment, or a combination thereof for the obtained pattern; and arranging phase shifters based on the obtained resolution easiness of the patterns adjacent within the distance R to give a phase difference in order of resolution difficulty (in ascending order of resolution easiness).

(3) A computer readable recording medium storing a program for designing a photomask in which a plurality of opening patterns for passing incident light are formed in a light-shielding film, and some patterns have phase shifters for giving a phase difference to the incident light transmitted through the patterns, for the design layout including patterns already having fixed phases, the program comprising the following steps of:

extracting an adjacent pattern pair within a predetermined range;

assigning priority to the extracted adjacent pattern pair;

generating a node from the design layout;

giving, to a node of a pattern having a fixed phase a phase value corresponding to the phase information of the pattern;

in order of priority levels of adjacent pattern pairs, (i) connecting nodes of the adjacent pattern pair so as not to form a closed loop of an odd number of nodes when neither nodes of the adjacent pattern pair have phase information, and (ii) giving phase information opposite to that of one node to the other node and sequentially giving phase information to nodes connected to the nodes of which phases are assigned such that the phases of 0° and 180° are alternately assigned to the adjacent nodes when only one node of the adjacent pattern pair has phase information; and setting an initial pattern for a group which is obtained by connecting nodes of adjacent pattern pairs and for which phase assignment is not done yet and determining phase by tracing the connected nodes from the initial pattern.

According to the photomask design method (1) or (2), phase differences can be preferentially assigned to adjacent patterns that are hard to resolve, so a shifter arrangement with higher resolution easiness can be realized.

According to the photomask design method (3), by dividing line segments, a more proper opposite region can be extracted.

According to the photomask design method (4), since the pattern to be extracted is changed in accordance with the pattern of the line segment pair of interest, the resolution easiness can be more accurately evaluated.

According to the photomask design method (5), since the number of portions to be subjected to resolution easiness evaluation is increased, more accurate evaluation can be performed.

According to the photomask design method (5), when the length of the opposite region is equal to or larger than the distance T, a two-dimensional technique is used, and when the length of the opposite region is smaller than the distance T, a one-dimensional technique is applied. With this arrangement, more accurate evaluation is enabled while maintaining high-speed processing.

According to the photomask design method (6), a so-called learning function using a table is provided to omit a process simulation, an experiment, or a combination thereof for an identical pattern, thereby enabling high-speed processing.

According to the photomask design method (7), the exposure simulation, the development simulation, or the etching simulation can be selectively used as the process simulation, so the resolution easiness can be more accurately evaluated.

According to the photomask design method (8), since the portion most difficult to resolve can be evaluated, a shifter arrangement with high resolution easiness can be realized.

According to the photomask design method (9), phase assignment according to priority is enabled without changing fixed phases.

According to the photomask design method (10), wasteful processing of an adjacent pattern pair already having a certain phase is not required to generate an phase inversion graph, the phase can be efficiently assigned.

According to the photomask design method (11), the phase of a pattern adjacent to the pattern having a fixed phase can be preferentially inverted.

According to the photomask design apparatus (1), phase differences can be preferentially assigned to adjacent patterns that are hard to resolve, so a shifter arrangement with higher resolution easiness can be realized.

According to the photomask design apparatus (2), phase differences can be preferentially assigned to adjacent patterns that are hard to resolve, so a shifter arrangement with higher resolution easiness can be realized.

According to the photomask design apparatus (3), phase assignment according to priority is enabled without changing fixed phases.

According to the computer readable recording medium (1), phase differences can be preferentially assigned to adjacent patterns that are hard to resolve, so a shifter arrangement with higher resolution easiness can be realized.

According to the computer readable recording medium (2), phase differences can be preferentially assigned to adjacent patterns that are hard to resolve, so a shifter arrangement with higher resolution easiness can be realized.

According to the computer readable recording medium (3), phase assignment according to priority is enabled without changing fixed phases.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents. For example, in the third to fifth embodiments, the shifter arrangement for adjacent pattern pairs is assigned in order of adjacent portion lengths. However, the shifter arrangement may be assigned in ascending order of resolution easiness (in order of difficulty in resolution), as in the first and second embodiments.

We claim:

1. A photomask design method of forming a plurality of opening patterns for passing incident light in a light-shielding film and arranging, on some patterns, phase shifters for giving a phase difference to the incident light transmitted through said patterns, comprising the following steps of:

extracting an adjacent pattern pair within a predetermined distance;

performing at least one of a process simulation or an experiment for patterns within another predetermined distance from an opposite region of said adjacent pattern pair to obtain resolution easiness representing an easiness in resolving said adjacent pattern pair; and arranging phase shifters on adjacent pattern pairs to give a phase difference in ascending order of resolution easiness.

2. A method according to claim 1, in which the step of obtaining resolution easiness includes performing at least one of the process simulation and the experiment for only said adjacent pattern pair.

3. A method according to claim 1, in which the step of obtaining resolution easiness includes performing at least one of the process simulation and the experiment for patterns formed of lines and spaces within a predetermined distance from a central point of an opposite region of said adjacent pattern pair in a direction perpendicular to the opposite region.

4. A method according to claim 1, in which the step of obtaining resolution easiness includes performing at least one of the process simulation and the experiment for patterns within a square region having a predetermined size and centered on a central point of an opposite region of said adjacent pattern pair.

5. A method according to claim 1, in which the step of obtaining resolution easiness includes performing at least one of the process simulation and the experiment for patterns within a square region having a predetermined size and centered on a central point of an opposite region of said adjacent pattern pair when opposite sides of said adjacent pattern pair and a side apart from said opposite sides within a predetermined distance are not parallel.

6. A method according to claim 1, in which the step of obtaining resolution easiness includes performing at least one of the process simulation and the experiment for patterns within a square region having a predetermined size and centered on a central point of an opposite region of said adjacent pattern pair when at least one of opposite sides of said adjacent pattern pair is placed in a direction neither perpendicular nor parallel to design coordinate axes of mask data.

7. A method according to claim 1, in which the step of obtaining resolution easiness includes a substep of subtracting a light intensity value at a central position of a middle region of said adjacent pattern pair from a smaller one of light intensity values at central positions of individual pattern portions of said adjacent pattern pair to obtain a difference as the resolution easiness, a larger difference value meaning easier resolving.

8. A method according to claim 1, in which the step of obtaining resolution easiness includes a substep of subtracting a light intensity value at a central position of a middle region of said adjacent pattern pair from an average value of light intensity values at central positions of individual pattern portions of said adjacent pattern pair to obtain a difference as the resolution easiness, a larger difference value meaning easier resolving.

9. A method according to claim 1, in which the step of obtaining resolution easiness includes a substep of setting a light intensity for resolving a resist as a slice level and subtracting a light intensity value at a central position of a middle region of said adjacent pattern pair from the slice level value to obtain a difference as the resolution easiness, a larger difference value meaning easier resolving.

10. A method according to claim 1, in which the step of obtaining resolution easiness includes a substep of obtaining a tilt angle of a tangent at the position between a central position of each pattern portions and a central point of an opposite region in a light intensity distribution as the resolution easiness, a larger tilt angle meaning easier resolving.

11. A method according to claim 1, in which the step of obtaining resolution easiness includes a substep of obtaining a difference of a pattern dimension from a desired dimension using at least one of the process simulation and the experiment by changing focus and dose, and obtaining a dose margin and a defocus margin at which the dimension difference falls within a predetermined range as the resolution easiness, a larger dose or defocus margin meaning easier resolving.

12. A method according to claim 1, in which the step of obtaining resolution easiness includes a substep of obtaining a difference of a pattern dimension from a desired dimension using at least one of the process simulation and the experiment by changing a process parameter, and obtaining a process parameter margin at which a dimension difference falls within a predetermined range as the resolution easiness, a larger margin of the process parameter meaning easier resolving.

13. A method according to claim 12, in which the step of obtaining resolution easiness includes obtaining process parameter margins at a plurality of positions of interest in an adjacent pattern pair and obtaining a common margin as the resolution easiness, a larger common margin meaning easier resolving.

14. A method according to claim 1, in which the step of obtaining resolution easiness includes a substep of obtaining an light intensity at a central position of a middle region of said adjacent pattern pair as the resolution easiness, a smaller light intensity meaning easier resolving.

15. A method according to claim 1, in which the step of obtaining resolution easiness has a table for storing resolution easiness and pattern arrangement information representing a characteristic feature of said predetermined pattern near said adjacent pattern pair, which has been subjected to at least one of the process simulation and the experiment, and when the pattern arrangement information of said pattern near said adjacent pattern pair is stored in said table, obtaining the resolution easiness from said table, and otherwise, performing one of the process simulation and the experiment to obtain the resolution easiness.

16. A method according to claim 1, in which the step of obtaining resolution easiness includes a substep of executing one of an exposure simulation, a development simulation, and an etching simulation or a combination of a plurality of simulations as the process simulation.

17. A method according to claim 1, in which the step of obtaining resolution easiness includes a substep of obtaining resolution easiness of one of line segment pairs included in said adjacent pattern pair, said line segment pair being determined to be most difficult to resolve.

18. A method according to claim 17, in which the step of obtaining resolution easiness includes a substep of defining a longest one of line segment pairs included in said adjacent pattern pair to be most difficult to resolve.

19. A method according to claim 1, in which the step of extracting said adjacent pattern pair includes a substep of dividing each adjacent pattern pair into line segments and extracting an adjacent line segment pair, and the step of obtaining resolution easiness includes obtaining resolution easiness of a pattern near said adjacent line segment pair.

20. A method according to claim 19, in which the line segment division step includes a substep of dividing a line segment at or near an intersection point of a perpendicular dropped from a vertex of an adjacent pattern opposing a pattern including a line segment of interest to said line segment of interest, said adjacent pattern being within a predetermined distance from said line segment of interest in a direction perpendicular to said line segment, so as not to make a length of each line segment after division smaller than a predetermined length.

21. A method according to claim 19, in which the line segment division step includes a substep of dividing a line segment at or near an intersection point of a perpendicular dropped from a vertex of a pattern to a line segment of interest, said pattern being within a predetermined distance from said line segment of interest in a direction perpendicular to said line segment, so as not to make a length of each line segment after division smaller than a predetermined length.

22. A method according to claim 19, in which the step of obtaining resolution easiness performs a one-dimensional process when length of opposing region of said adjacent pattern pair is not more than a predetermined distance T and a two-dimensional process when the length of opposing region of said adjacent pattern pair is more than the predetermined distance T.

23. A photomask design method of forming a plurality of opening patterns for passing incident light in a light-shielding film, the opening patterns including patterns already having fixed phases, and arranging, on some patterns, phase shifters for giving a phase difference to the incident light transmitted through said patterns, comprising the following steps of:

extracting an adjacent pattern pair within a predetermined range;

assigning priority to said extracted adjacent pattern pair;

generating a node from a design layout and giving, to a node of a pattern having a fixed phase, a phase value corresponding to phase information of said pattern;

in order of priority levels of adjacent pattern pairs, (i) connecting nodes of the adjacent pattern pair so as not to form a closed loop of an odd number of nodes when neither nodes of the adjacent pattern pair have phase information, and (ii) giving phase information opposite to that of one node to the other node and sequentially giving phase information to nodes connected to the nodes of which phases are assigned such that the phases of 0° and 180° are alternately assigned to the adjacent nodes when only one node of the adjacent pattern pair has phase information; and setting an initial pattern for a group which is obtained by connecting nodes of adjacent pattern pairs and for which phase assignment is not done yet and determining phase by tracing the connected nodes from the initial pattern.

24. A method according to claim 23, in which the step of extracting said adjacent pattern pair includes a substep of omitting extraction of an adjacent pattern pair whose adjacent patterns already have fixed phases.

25. A method according to claim 23, in which the step of assigning priority includes a substep of assigning higher priority to an adjacent pattern pair in which only one of adjacent patterns has a fixed phase than that of an adjacent pattern pair not having a fixed phase.

26. A computer readable recording media storing a program for designing a photomask in which a plurality of opening patterns for passing incident light are formed in a light-shielding film, and some patterns have phase shifters for giving a phase difference to the incident light transmitted through the patterns, the program comprising the following steps of:

decomposing patterns into line segments;

extracting line segment pairs which are adjacent within a predetermined distance R and belong to different patterns;

obtaining, in units of line segments, a pattern formed of lines and spaces within a predetermined distance S from the central position of an opposite region where the line segments oppose each other in a direction perpendicular to the line segments;

obtaining resolution easiness representing the easiness in resolving the line segments of adjacent patterns using a process simulation, an experiment, or a combination thereof for the obtained pattern; and determining a phase shifter arrangement to give a phase difference to the line segments of adjacent patterns in order of resolution difficulty (in ascending order of resolution easiness).

27. A computer readable recording medium storing a program for designing a photomask in which a plurality of opening patterns for passing incident light are formed in a light-shielding film, and some patterns have phase shifters for giving a phase difference to the incident light transmitted through the patterns, the program comprising the following steps of:

extracting an adjacent pattern pair within a predetermined distance R;

decomposing each pattern into line segments;

obtaining a pattern formed of lines and spaces within a distance S from the central position of an opposite region in a direction perpendicular to the line segments, the opposite region being expected to be most hard to resolve;

obtaining resolution easiness representing the easiness in resolving the adjacent patterns using a process simulation, an experiment, or a combination thereof for the obtained pattern; and arranging phase shifters based on the obtained resolution easiness of the patterns adjacent within the distance R to give a phase difference in order of resolution difficulty (in ascending order of resolution easiness).

28. A computer readable recording medium storing a program for designing a photomask in which a plurality of opening patterns for passing incident light are formed in a light-shielding film, and some patterns have phase shifters for giving a phase difference to the incident light transmitted through the patterns, for the design layout including patterns already having fixed phases, the program comprising the following steps of:

extracting an adjacent pattern pair within a predetermined range;

assigning priority to the extracted adjacent pattern pair;

generating a node from the design layout;

giving, to a node of a pattern having a fixed phase a phase value corresponding to the phase information of the pattern;

in order of priority levels of adjacent pattern pairs, (i) connecting nodes of the adjacent pattern pair so as not to form a closed loop of an odd number of nodes when neither nodes of the adjacent pattern pair have phase information, and (ii) giving phase information opposite to that of one node to the other node and sequentially giving phase information to nodes connected to the nodes of which phases are assigned such that the phases of 0° and 180° are alternately assigned to the adjacent nodes when only one node of the adjacent pattern pair has phase information; and setting an initial pattern for a group which is obtained by connecting nodes of adjacent pattern pairs and for which phase assignment is not done yet and determining phase by tracing the connected nodes from the initial pattern.

* * * * *